United States Patent
Kang

(10) Patent No.: US 9,858,993 B2
(45) Date of Patent: Jan. 2, 2018

(54) NON-VOLATILE MEMORY DEVICE AND METHOD OF PROGRAMMING THE SAME

(71) Applicant: SAMSUNG ELECTRONICS CO., LTD., Suwon-si, Gyeonggi-do (KR)

(72) Inventor: Dong-Ku Kang, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/601,698

(22) Filed: May 22, 2017

(65) Prior Publication Data

US 2017/0256308 A1    Sep. 7, 2017

Related U.S. Application Data

(63) Continuation of application No. 15/067,620, filed on Mar. 11, 2016, now Pat. No. 9,691,472.

(30) Foreign Application Priority Data

Mar. 13, 2015    (KR) .................. 10-2015-0035152

(51) Int. Cl.
| | |
|---|---|
| G11C 11/34 | (2006.01) |
| G11C 11/56 | (2006.01) |
| G11C 16/10 | (2006.01) |
| G11C 16/04 | (2006.01) |
| G11C 16/32 | (2006.01) |

(52) U.S. Cl.
CPC ...... *G11C 11/5628* (2013.01); *G11C 16/0483* (2013.01); *G11C 16/10* (2013.01); *G11C 16/32* (2013.01); *G11C 2211/5641* (2013.01); *G11C 2211/5648* (2013.01)

(58) Field of Classification Search
None
See application file for complete search history.

(56) References Cited

U.S. PATENT DOCUMENTS

| | | | |
|---|---|---|---|
| 7,170,788 | B1 | 1/2007 | Wan et al. |
| 7,474,560 | B2 | 1/2009 | Aritome |
| 7,949,821 | B2 * | 5/2011 | Han .................. G11C 8/08 |
| | | | 365/185.18 |

(Continued)

FOREIGN PATENT DOCUMENTS

| | | |
|---|---|---|
| KR | 10-2011-001102 A | 1/2011 |
| KR | 10-2011-0001701 A | 1/2011 |

(Continued)

*Primary Examiner* — Uyen B Tran
(74) *Attorney, Agent, or Firm* — Volentine & Whitt, PLLC

(57) ABSTRACT

A non-volatile memory device and a method of programming a non-volatile memory device including a plurality of memory cells that are stacked in a vertical direction over a substrate and connected to n word lines, wherein n is an integer greater than or equal to 3. The method includes programming memory cells of second to n–1-th word lines, from among first to n-th word lines that are sequentially disposed in the vertical direction over the substrate, to a multi-level state, wherein a multi-level program operation is sequentially performed from the second to n–1-th word lines in an order in which the word lines are disposed; and programming memory cells of the first word line to a single level state after the programming memory cells of the second to n–1-th word lines to a multi-level state.

20 Claims, 35 Drawing Sheets

(56) References Cited

U.S. PATENT DOCUMENTS

| | | |
|---|---|---|
| 8,488,386 B2 | 7/2013 | Kim et al. |
| 2008/0031041 A1 | 2/2008 | Han |
| 2009/0231916 A1 | 9/2009 | Kim et al. |
| 2012/0246395 A1* | 9/2012 | Cho .................... G06F 12/0246 |
| | | 711/103 |
| 2014/0063937 A1 | 3/2014 | Goldman |

FOREIGN PATENT DOCUMENTS

| | | | | |
|---|---|---|---|---|
| KR | 1020110001102 | * | 6/2011 | ............. G11C 16/10 |
| KR | 10-1075505 B1 | | 10/2011 | |
| KR | 10-2012-0005841 A | | 1/2012 | |

* cited by examiner

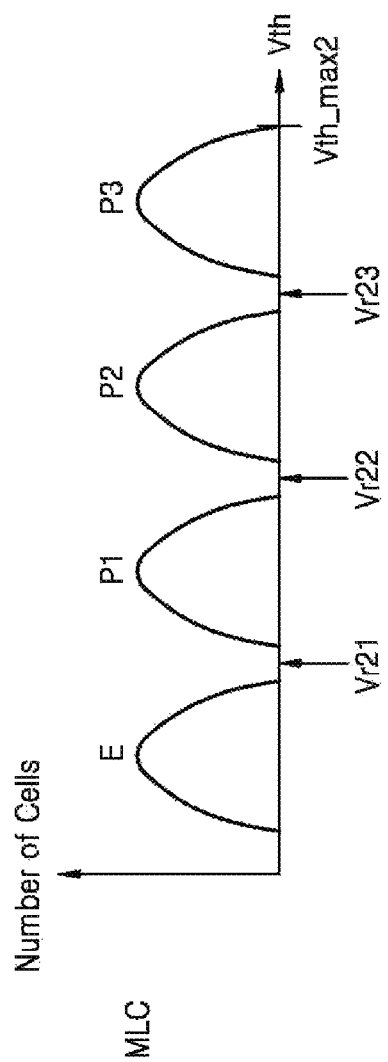

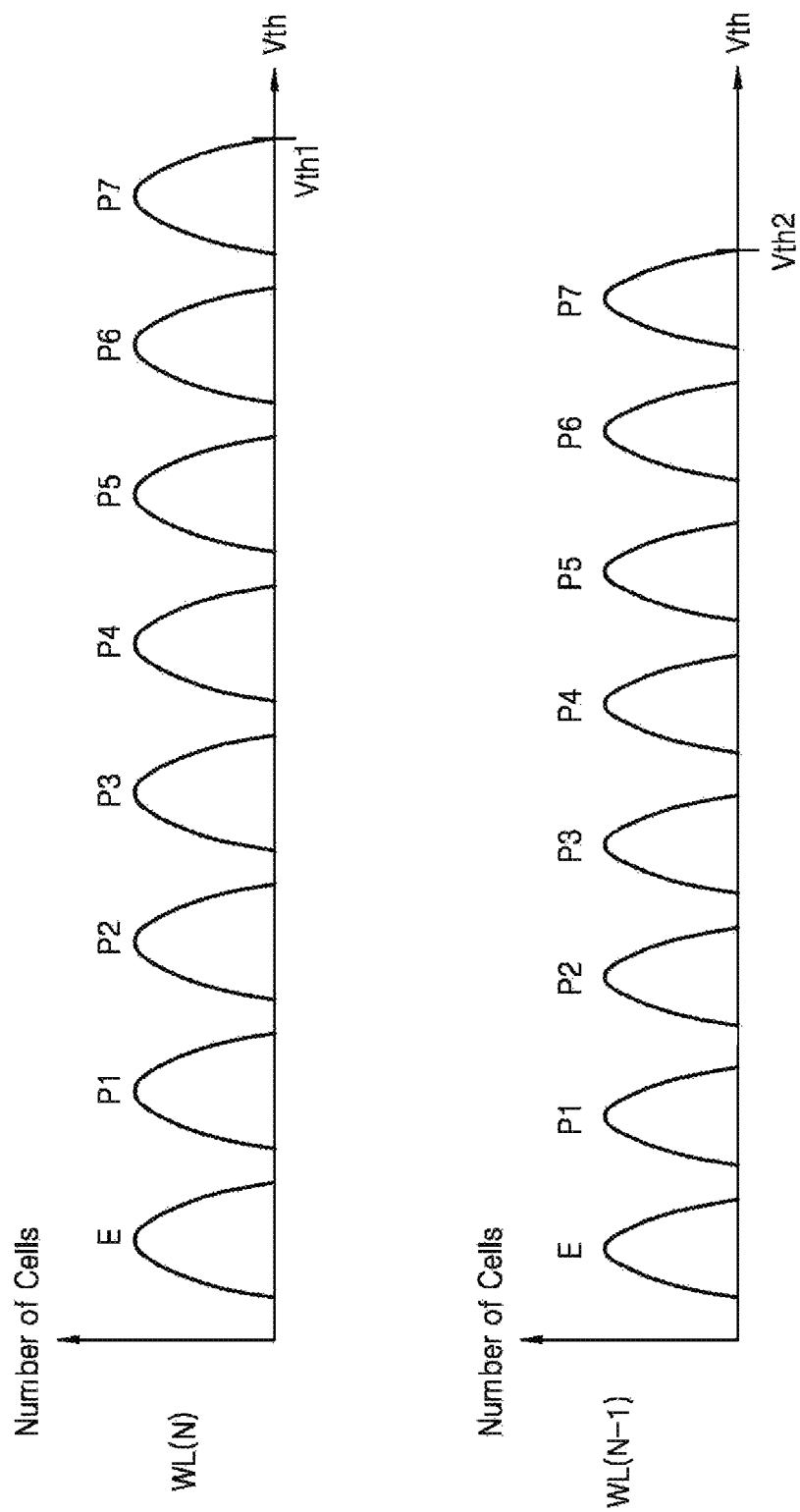

FIG. 12

| WL | WL(N) | WL(N-1) | |
|---|---|---|---|
| Vth_max | Vth1 | Vth2 | Vth1 ≥ Vth2 |
| Vpgm_max | Vpgm1 | Vpgm2 | Vpgm1 ≥ Vpgm2 |
| Vpass | Vpass1 | Vpass2 | Vpass1 ≥ Vpass2 |

FIG. 16

| WL | WL(N) | WL (N-1) | WL (N-2) | |
|---|---|---|---|---|
| Vth_max | Vth1 | Vth2 | Vth3 | Vth1 ≥ Vth2 ≥ Vth3 |
| Vpgm_max | Vpgm1 | Vpgm2 | Vpgm3 | Vpgm1 ≥ Vpgm2 ≥ Vpgm3 |
| Vpass | Vpass1 | Vpass2 | Vpass3 | Vpass1 ≥ Vpass2 ≥ Vpass3 |

FIG. 22A

| WL | WL(N~K) | WL(N-1) | WL(K+1) | |
|---|---|---|---|---|
| Vth_max | Vth1 | Vth2 | Vth3 | Vth1 = Vth3 ≥ Vth2 |
| Vpgm_max | Vpgm1 | Vpgm2 | Vpgm3 | Vpgm1 = Vpgm3 ≥ Vpgm2 |
| Vpass | Vpass1 | Vpass2 | Vpass3 | Vpass1 = Vpass3 ≥ Vpass2 |

FIG. 22B

| WL | WL(N~K) | WL(N-1) | WL(K+1) | |
|---|---|---|---|---|
| Vth_max | Vth1 | Vth2 | Vth3 | Vth1 ≥ Vth2 = Vth3 |
| Vpgm_max | Vpgm1 | Vpgm2 | Vpgm3 | Vpgm1 ≥ Vpgm2 = Vpgm3 |
| Vpass | Vpass1 | Vpass2 | Vpass3 | Vpass1 ≥ Vpass2 = Vpass3 |

FIG. 26

| WL | WL(N) | WL(N-1) | DWL | |
|---|---|---|---|---|
| Vth_max | Vth1 | Vth2 | - | Vth1 ≥ Vth2 |
| Vpgm_max | Vpgm1 | Vpgm2 | - | Vpgm1 ≥ Vpgm2 |
| Vpass | Vpass1 | Vpass2 | Vbias | Vpass1 ≥ Vpass2 ≥ Vbias |

NON-VOLATILE MEMORY DEVICE AND METHOD OF PROGRAMMING THE SAME

CROSS-REFERENCE TO RELATED APPLICATION

This is a Continuation of U.S. application Ser. No. 15/067,620, filed Mar. 11, 2016, which claims priority under 35 U.S.C. §119 to Korean Patent Application No. 10-2015-0035152, filed on Mar. 13, 2015, in the Korean Intellectual Property Office, the entire contents of which are hereby incorporated by reference.

BACKGROUND

The inventive concept described herein relates to a memory device, and more particularly, to a non-volatile memory device and a method of programming a non-volatile memory device.

Memory devices may be used to store data, and may be classified as volatile memory devices and non-volatile memory devices. A flash memory device, which is an example of a non-volatile memory device, may be used in a portable phone, a digital camera, a portable digital assistant (PDA), a portable computer device, a fixed computer device, and other devices.

SUMMARY

Embodiments of inventive concept provide a non-volatile memory device and a method of programming the same which may improve reliability.

Embodiments of the inventive concept provide a method of programming a non-volatile memory device including a plurality of memory cells that are stacked in a vertical direction over a substrate and that are connected to n word lines, wherein n is an integer greater than or equal to 3. The method includes programming memory cells of second to n−1-th word lines, from among first to n-th word lines that are sequentially disposed in the vertical direction over the substrate, to a multi-level state, wherein a multi-level program operation is sequentially performed from the second to n−1-th word lines in an order in which the word lines are disposed. The method further includes programming memory cells of the first word line to a single level state after the programming of memory cells of the second to n−1-th word lines to a multi-level state.

The plurality of memory cells may include a first region including the memory cells of the second to n−1-th word lines and a second region including the memory cells of the first word line. The first region may be a multi-level cell region configured to store data having at least 2 bits per memory cell, and the second region may be a single-level cell region configured to store 1-bit data per memory cell.

The programming of the memory cells of the second to n−1-th word lines to a multi-level may include sequentially programming the memory cells of the second to n−1-th word lines in an order in which the second to n−1-th word lines are disposed.

The method may further include programming the memory cells of the n-th word line to a single level state after the programming of the memory cells of the second to n−1-th word lines to a multi-level state.

A second pass voltage applied to the first word line may be equal to or lower than a first pass voltage applied to at least one of the second to n−1-th word lines.

From among the memory cells of the second to n−1-th word lines, the memory cells of the second and n−1-th word lines may store 2-bit data, and the memory cells of the third to n−2-th word lines may store 3-bit data.

The non-volatile memory device may include a plurality of planes that are selected by different string selection lines and that share the first to n-th word lines therebetween. After memory cells of different planes connected to one word line are sequentially programmed in units of planes, memory cells connected to another word line may be programmed.

Embodiments of the inventive concept further provide a method of programming a vertical NAND (VNAND) flash memory system including a NAND flash memory device that includes a plurality of memory cells which are stacked in a vertical direction over a substrate and connected to word lines, and a memory controller configured to control a program order of the VNAND flash memory device. The method includes sequentially programming memory cells of a first region including an N-th word line, from memory cells of the N-th word line to memory cells of a word line disposed farthest from the N-th word line, wherein N is an integer equal to or greater than 2. The method further includes programming memory cells of an N−1-th word line after the programming of the memory cells of the first region. A maximum value of threshold voltages of the memory cells of the N−1-th word line is equal to or lower than a maximum value of threshold voltages of the memory cells of the N-th word line.

During the programming of memory cells of a K-th word line (K is an integer that is greater than N), a first pass voltage may be applied to the N-th word line, and a second pass voltage having a lower voltage level than the first pass voltage is applied to the N−1-th word line.

Embodiments of the inventive concept further provide a method of programming a non-volatile memory device including a plurality of memory cells that are connected to n word lines and that are stacked in a vertical direction over a substrate between a ground selection transistor and a string selection transistor. The method includes programming memory cells of a first word line from the n word lines that are adjacent the ground selection transistor and memory cells of an n-th word line from among the n word lines that are adjacent the string selection transistor, after programming memory cells of second to n−1-th word lines from among the n word lines. A maximum value of threshold voltages of the memory cells of the first word line is lower than or equal to a maximum value of threshold voltages of the memory cells of the second word line.

BRIEF DESCRIPTION OF THE DRAWINGS

Exemplary embodiments of the inventive concept will be more clearly understood from the following detailed description taken in conjunction with the accompanying drawings in which:

FIGS. 8A, 8B and 8C are graphs showing distributions of memory cells relative to a threshold voltage after the programming of a memory device is finished.

FIGS. 11A and 11B are graphs showing distributions of threshold voltages of memory cells of an N-th word line and an N−1-th word line.

FIG. 12 is a table showing a maximum value of threshold voltages of memory cells, a maximum value of program voltages applied to word lines, and a pass voltage in the program method of FIG. 9.

FIG. 16 is a table showing a maximum value of threshold voltages of memory cells, a maximum value of program voltages applied to word lines, and a pass voltage in the program method of FIG. 14.

FIGS. 22A and 22B are tables showing a maximum value of threshold voltages of memory cells, a maximum value of program voltages applied to word lines, and a pass voltage in the program method of FIG. 20.

FIG. 26 is a table showing threshold voltages of the memory cells of FIG. 25 and voltages applied to the memory cells and the dummy memory cells.

DETAILED DESCRIPTION OF THE EMBODIMENTS

Figure 1:
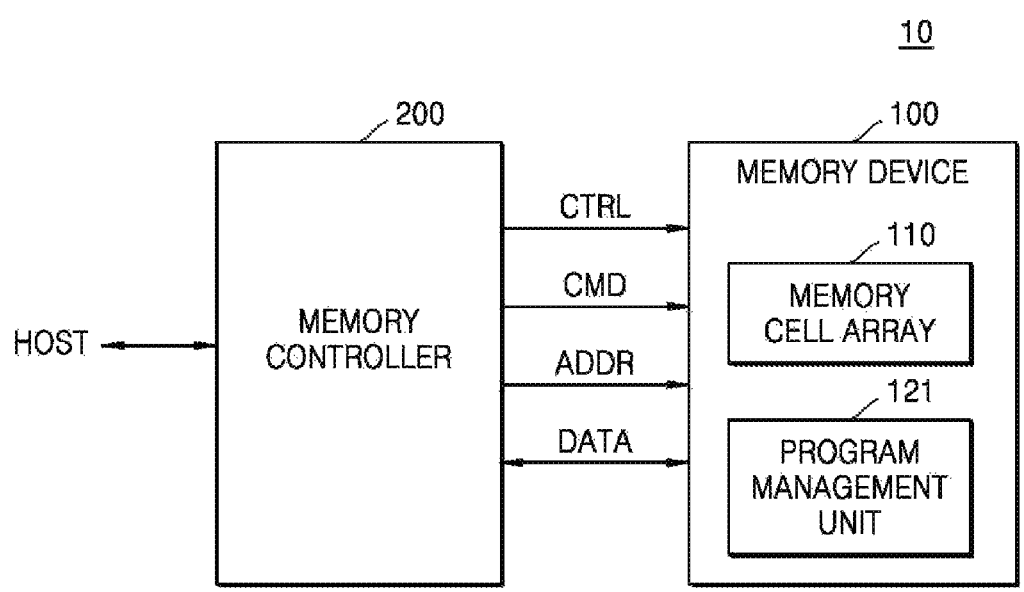
FIG. 1 is a schematic block diagram illustrating a memory system according to an embodiment of the inventive concept.

As used herein, the term "and/or" includes any and all combinations of one or more of the associated listed items. Expressions such as "at least one of" when preceding a list of elements, modify the entire list of elements and do not modify the individual elements of the list.

The inventive concept will now be described more fully with reference to the accompanying drawings, in which embodiments of the inventive concepts are shown. However, the inventive concept is not limited thereto and it will be understood that various changes in form and details may be made therein without departing from the spirit and scope of the inventive concept. That is, descriptions on particular structures or functions may be presented merely for explaining exemplary embodiments of the inventive concepts Throughout the drawings, like reference numerals denote like elements.

Also, terms such as "include" or "comprise" may be construed to denote a certain characteristic, number, step, operation, constituent element, or a combination thereof, but may not be construed to exclude the existence of or a possibility of addition of one or more other characteristics, numbers, steps, operations, constituent elements, or combinations thereof.

As used herein, the term "or" includes any and all combinations of one or more of the associated listed items. For example, an expression "A or B" may include A, B, or both A and B.

Terms such as "first" and "second" are used herein merely to describe a variety of constituent elements, but the constituent elements are not limited by the terms. For example, such terms are not intended to limit the orders and/or degrees of importance of constituent elements. Such terms are used only for the purpose of distinguishing one constituent element from another constituent element. For example, a first user device and a second user device are both user devices but indicate different user devices. For example, without departing from the right scope of the inventive concept, a first constituent element may be referred to as a second constituent element, and vice versa.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

Terms used in the specification are for explaining specific exemplary embodiments, not for limiting the present inventive concept. Thus, an expression used in a singular form in the specification also includes the expression in its plural form unless clearly specified otherwise in context.

Unless defined otherwise, all terms used herein including technical or scientific terms have the same meanings as those generally understood by those of ordinary skill in the art to which the inventive concept may pertain. The terms as those defined in generally used dictionaries are construed to have meanings matching that in the context of related technology and, unless clearly defined otherwise, are not construed to be ideally or excessively formal.

FIG. 1 is a schematic block diagram illustrating a memory system 10 according to an embodiment of the inventive concept.

Referring to FIG. 1, the memory system 10 includes a memory device 100 and a memory controller 200. The memory device 100 includes a memory cell array 110 and a program management unit 121.

Figure 2:
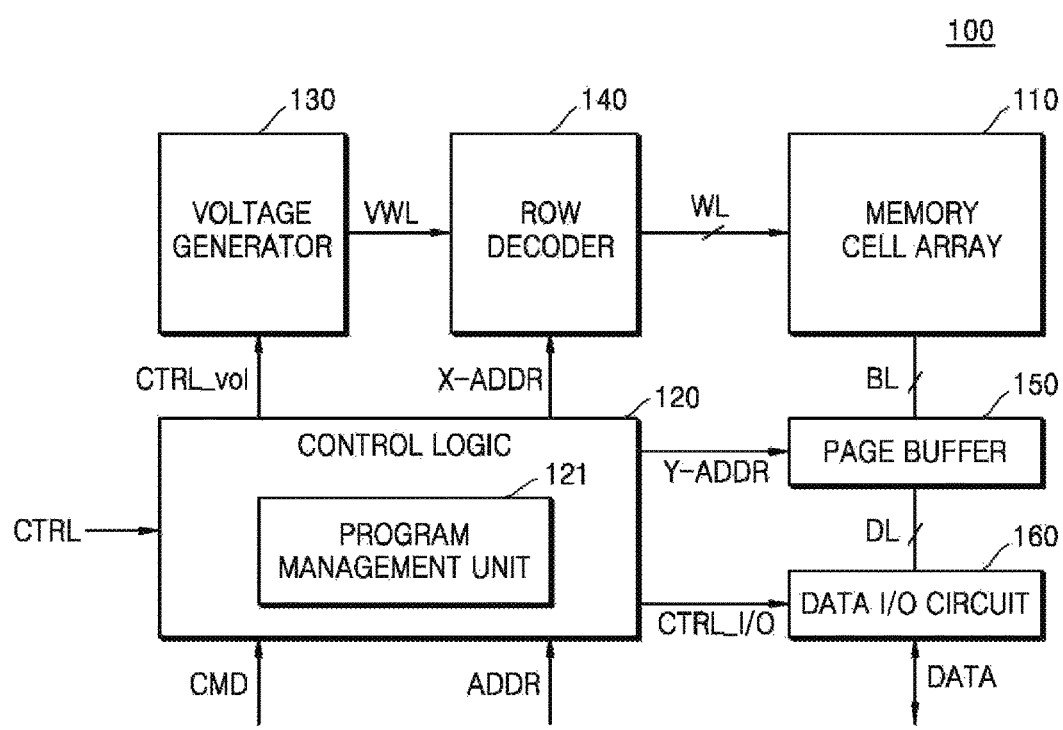
FIG. 2 is a detailed block diagram illustrating a memory device included in the memory system of FIG. 1, according to an embodiment of the inventive concept.

The memory cell array 110 may include a plurality of memory cells disposed in regions in which a plurality of word lines (refer to WL in FIG. 2) intersect a plurality of bit lines (refer to BL in FIG. 2). In an embodiment of the inventive concept, the plurality of memory cells may be flash memory cells, and the memory cell array 110 may be a NAND flash memory cell array or a NOR flash memory cell array.

Hereinafter, embodiments of the inventive concept will be described assuming that the memory cells are NAND flash memory cells. For example, the plurality of memory cells may be NAND flash memory cells arranged in a 2-dimensional horizontal structure (refer to FIGS. 3 and 4). In another example, the plurality of memory cells may be vertical NAND (VNAND) flash memory cells arranged in a three-dimensional (3D) vertical structure (refer to FIGS. 5 to 7 and 24). However, the inventive concept is not limited thereto. In other exemplary embodiments, the plurality of memory cells may be resistive memory cells, such as resistive RAM (RRAM) memory cells, phase-change RAM (PRAM) memory cells, or magnetic RAM (MRAM) memory cells.

In an embodiment of the inventive concept, the memory cell array 110 may be divided into a plurality of memory groups, each of which may include a plurality of memory cells. For example, the plurality of memory groups may be divided into memory blocks. In another example, the plurality of memory groups may be divided into word lines. In another example, the plurality of memory groups may be divided into pages. In another example, the plurality of memory groups may be divided into dies. However, the inventive concept is not limited thereto, and the plurality of memory groups may be divided into arbitrary program units.

In an embodiment of the inventive concept, each of the memory cells included in the memory cell array 110 may be a single-level cell (SLC) configured to store 1-bit data. In another exemplary embodiment, each of the memory cells included in the memory cell array 110 may be a multi-level cell (MLC) configured to store 2-bit data. In another exemplary embodiment, each of the memory cells included in the memory cell array 110 may be a triple-level cell (TLC) configured to store 3-bit data. However, the inventive concept is not limited thereto. In another exemplary embodiment, each of the memory cells included in the memory cell array 110 may store four bits or more of data.

The program management unit 121 determines an order in which the memory cells of the memory cell array 110 are programmed, and controls the number of bits of data that are to be stored in the memory cells or a level of a voltage applied to the memory cells when the memory cells are programmed in the determined order. The program management unit 121 may determine a program order such that memory cells of an N−1-th word line are programmed after memory cells of a first region including an N-th word line are programmed in a memory block included in the memory cell array 110. The N−1-th word line may be a word line disposed more outward than the N-th word line in a memory cell string, and may refer to a word line disposed adjacent to a ground selection line or a string selection line. Memory cells of the first region including the N-th word line may be memory cells disposed farther from the ground selection transistor or the string selection transistor than the memory cells of the N−1-th word line. The program management unit 121 determines the program order such that memory cells disposed close to the ground selection transistor or the string selection transistor are programmed after the memory cells disposed far from the ground selection transistor or the string selection transistor are programmed.

In this case, the program management unit 121 determines the number of bits of data to be stored in the memory cells of the N−1-th word line or a level of a program voltage such that a maximum value of a threshold voltage of the memory cells of the N−1-th word line is equal to or less than a maximum value of a threshold voltage of the memory cells of the N-th word line. In another exemplary embodiment, the number of bits of data programmed in the memory cells of the N−1-th word line may be determined by the memory controller 200.

The memory controller 200 controls the memory device 100 to read data stored in the memory device 100 or write data in the memory device 100 in response to read/write requests from a host HOST. Specifically, the memory controller 200 provides an address ADDR, a command CMD, and a control signal CTRL to the memory device 100, and controls program (or write), read, and erase operations of the memory device 100. Also, data DATA for a program operation and read data DATA may be transmitted and received between the memory controller 200 and the memory device 100.

Although not shown, the memory controller 200 may include RAM, a processing unit, a host interface, and a memory interface. The RAM may be used as a working memory of the processing unit, and the processing unit may control an operation of the memory controller 200. The host interface may use a protocol configured to exchange data between the host and the memory controller 200. For example, the memory controller 200 may communicate with the outside (e.g., the host HOST) via at least one of various interface protocols, such as universal serial bus (USB), multimedia card (MMC), peripheral component interface-express (PCI-E), advanced technology attachment (ATA), serial-ATA (SATA), parallel-ATA (PATA), small computer system interface (SCSI), enhanced small device interface (ESDI), and intelligent drive electronics (IDE), among others.

FIG. 2 is a detailed block diagram illustrating the memory device 100 included in the memory system 10 of FIG. 1, according to an embodiment of the inventive concept.

Referring to FIG. 2, the memory device 100 may includes a memory cell array 110, a control logic 120, a voltage generator 130, a row decoder 140, a page buffer 150, and a data input/output circuit 160. Hereinafter, constituent elements included in the memory device 100 will be described in detail.

The memory cell array 110 is connected to a plurality of word lines WL and a plurality of bit lines BL. Although not shown, the memory cell array 110 may be connected to at least one string selection line SSL and at least one ground selection line GSL. The memory cell array 110 may include a plurality of memory cells (refer to MC of FIG. 4, MC1 to MC8 of FIG. 6, and MC1 to MC5 of FIG. 24) disposed in regions in which the plurality of word lines WL intersect the plurality of bit lines BL. Each of the plurality of memory cells may store 1-bit data or multi-bit data.

When an erase voltage is applied to the memory cell array 110, the plurality of memory cells MC may be put into an erase state. When a program voltage is applied to the memory cell array 110, the plurality of memory cells MC may be put into a program state. In this case, each of the memory cells MC may have an erase state E and at least one program state, which are divided according to a threshold voltage Vth.

In an embodiment of the inventive concept, when the memory cell MC is a single-level cell, the memory cell MC may have an erase state and a program state. In another exemplary embodiment, the memory cell MC may have one of an erase state and a plurality of program states. For example, when the memory cell MC is a multi-level cell, the memory cell MC may have an erase state and three program states. In another example, when the memory cell MC is a triple-level cell, the memory cell MC may have an erase state and seven program states.

The control logic 120 outputs various output signals for writing data in the memory cell array 110 or reading data from the memory cell array 110 based on the command CMD, the address ADDR, and the control signal CTRL received from the memory controller 200. Thus, the control logic 120 may generally control various operations of the memory device 100.

The various control signals output by the control logic 120 are provided to the voltage generator 130, the row decoder 140, and the page buffer 150. Specifically, the control logic 120 provides a voltage control signal CTRL_vol to the voltage generator 130, provides a row address X-ADDR to the row decoder 140, and provides a column address Y-ADDR to the page buffer 150. However, the inventive concept is not limited thereto, and the control logic 120 may further provide other control signals to the voltage generator 130, the row decoder 140, and the page buffer 150.

The voltage generator 130 generates various types of voltages for performing program, read, and erase operations on the memory cell array 110, based on the voltage control signal CTRL_vol. Specifically, the voltage generator 130 generates a word line driving voltage VWL for driving the plurality of word lines WL. In this case, the word line driving voltage VWL may be a program voltage (or write voltage), a read voltage, an erase voltage, an inhibition voltage, or a program verification voltage. Although not shown, the voltage generator 130 may further generate a string selection line driving voltage VSSL for driving a plurality of string selection lines SSL and a ground selection line driving voltage VGSL for driving a plurality of ground selection lines GSL.

The row decoder 140 is connected to the memory cell array 110 through the plurality of word lines WL, and enables some of the plurality of word lines WL in response to the row address X-ADDR received from the control logic 120. Specifically, during a read operation, the row decoder 140 may apply a read voltage to a selected word line, and may apply a non-selection voltage to unselected word lines. Also, during a program operation, the row decoder 140 may apply a program voltage to a selected word line, and apply a non-selection voltage (or referred to as a pass voltage) to unselected word lines. Hereinafter, the non-selection voltage will be referred to as a pass voltage.

The page buffer 150 is connected to the memory cell array 110 through the plurality of bit lines BL. Specifically, during a read operation, the page buffer 150 operates as a sense amplifier and outputs data DATA stored in the memory cell array 110. Meanwhile, during a program operation, the page buffer 150 operates as a write driver and inputs data DATA to be stored to the memory cell array 110.

The data input/output (I/O) circuit 160 may transmits externally input data DATA to the page buffer 150 or transmits data DATA output by the page buffer 150 through a plurality I/O pins or a data bus to the outside, for example to the memory controller (refer to 200 in FIG. 1).

In an embodiment of the inventive concept, the control logic 120 may includes the program management unit 121. As described above with reference to FIG. 1, the program management unit 121 determines an order in which the memory cells of the memory cell array 110 are programmed, and controls the number of bits of data to be stored in the memory cells or a level of a voltage to be applied to the memory cells when the memory cells are programmed in the determined order.

The program management unit 121 determines a program order such that memory cells of an N−1-th word line are programmed after memory cells of a first region including an N-th word line are programmed in a memory block (refer to 110a in FIG. 3 or 110b in FIG. 5) included in the memory cell array 110. Thereafter, the program management unit 121 generates the row address X-ADDR such that the memory cell array 110 is programmed in the determined order. In this case, an N−1-th word line may be a word line that is adjacent to a ground selection line or a string selection line and disposed relatively outward from among a plurality of word lines included in the memory block. The N-th word line included in the first region may be a word line that is disposed more inward than the N−1-th word line, or in other words relatively further away from a ground selection line or a string selection line than the N−1-th word line. Thus, after memory cells disposed relatively inward from among memory cells included in the memory block are first programmed, memory cells disposed outward, for example, memory cells adjacent to ground selection transistors or string selection transistors, may be subsequently or finally (lastly) programmed.

The program management unit 121 determines the number of bits (e.g., a single bit or multiple bits) of data that is programmed in memory cells of the N−1-th word line or determines a level of a program voltage such that a maximum value of threshold voltages of the memory cells of the N−1-th word line is equal to or lower than a maximum value of threshold voltages of the memory cells of the N-th word line.

The program management unit 121 generates a voltage control signal CTRL_vol based on the determined number of bits or the determined level of the program voltage. The voltage generator 130 generates a voltage that is applied to the memory cells of the N−1-th word line and a voltage that is applied to the memory cells of the N-th word line based on the voltage control signal CTRL_vol. The voltage applied to the memory cells of the N−1-th word line and the voltage applied to the memory cells of the N-th word line may include, for example, a program voltage and a pass voltage and may further include a program detection voltage and a read voltage. In one exemplary embodiment, a read control unit (not shown) additionally included in the control logic 120 may determine voltage levels of read voltages respectively applied to the memory cells of the N−1-th word line and the N-th word line based on the number of bits of data or the level of the program voltage, which is determined by the program management unit 121, and provide a signal indicating the determined voltage levels as the voltage control signal CTRL_vol to the voltage generator 130.

In another exemplary embodiment of the inventive concept, the number of bits of data that is programmed in the memory cells of the N−1-th word line may be determined by the memory controller 200 and provided as a command (CMD) signal, and the program management unit 121 may generate the voltage control signal CTRL_vol based on the command CMD signal.

A program method of the program management unit 121 will be described in detail below with reference to FIGS. 3 to 26.

Figure 3:
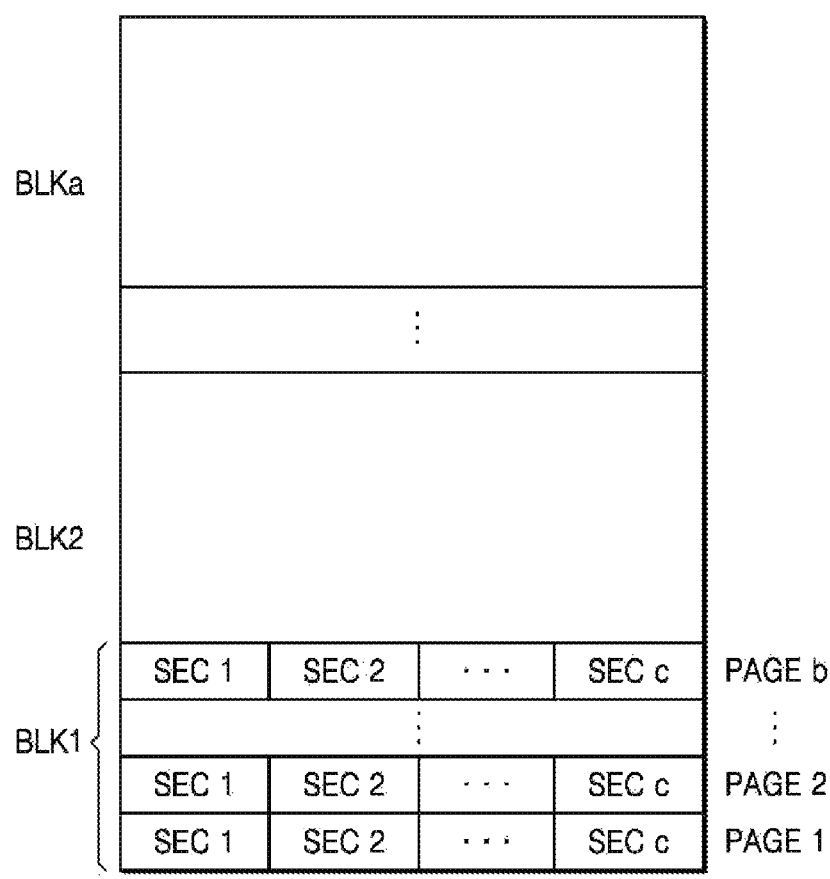
FIG. 3 is a diagram illustrating a memory cell array included in the memory device of FIG. 2.

FIG. 3 is a diagram illustrating the memory cell array 110 included in the memory device 100 of FIG. 2, according to an embodiment of the inventive concept.

Referring to FIG. 3, the memory cell array 110 may be a flash memory cell array. In this case, the memory cell array 110 may include a (a is an integer equal to or greater than 2) memory blocks BLK1 to BLKa, each of which may include b (b is an integer equal to or greater than 2) pages PAGE1 to PAGEb. Each of the pages PAGE1 to PAGEb may include c (c is an integer equal to or greater than 2) sectors SEC1 to SECc. Although FIG. 3 illustrates only the memory block BLK1 including the pages PAGE0 to PAGEb and sectors SEC1 to SECc for brevity, each of the other memory blocks BLK2 to BLKa may have the same structure as the memory block BLK1.

Figure 4:
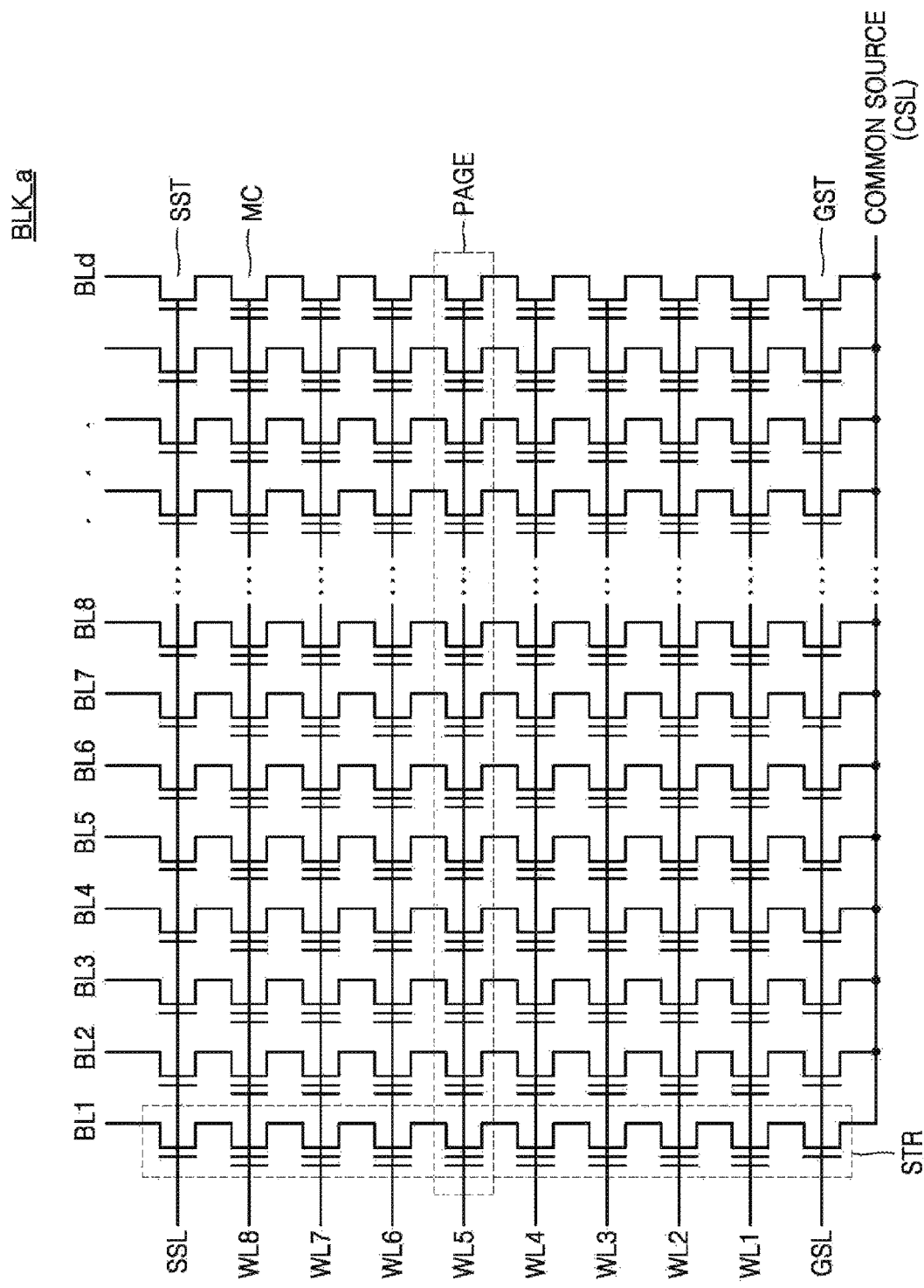
FIG. 4 is a circuit diagram illustrating a memory block included in the memory cell array of FIG. 3, according to an embodiment of the inventive concept.

FIG. 4 is a circuit diagram illustrating an example of a first memory block BLK_a of memory blocks included in the memory cell array 110 of FIG. 3.

Referring to FIG. 4, the first memory block BLK_a may be a horizontal NAND flash memory, and each of the memory blocks BLK1 to BLKa shown in FIG. 3 may be embodied as shown in FIG. 4. For example, the first memory block BLK_a may include d (d is an integer equal to or greater than 2) strings STR, each of which may include 8 memory cells connected in series. Each of the strings STR may include a string selection transistor SST and a ground selection transistor GST, which may be respectively connected to two ends of the memory cells MC connected in series. Here, the number of strings STR, the number of word lines WL, and the number of bit lines BL may be variously changed according to exemplary embodiments.

In the NAND flash memory device having the structure shown in FIG. 4, an erase operation may be performed in units of memory blocks, and a program operation may be performed in units of pages PAGE corresponding respectively to the word lines WL1 to WL8. For example, when the memory cell MC is a single-level cell, one page PAGE may correspond to each of the word lines WL1 to WL8. In another example, when the memory cell MC is a multi-level cell or a triple-level cell, a plurality of pages PAGE may correspond to each of the word lines WL1 to WL8.

Figure 5:
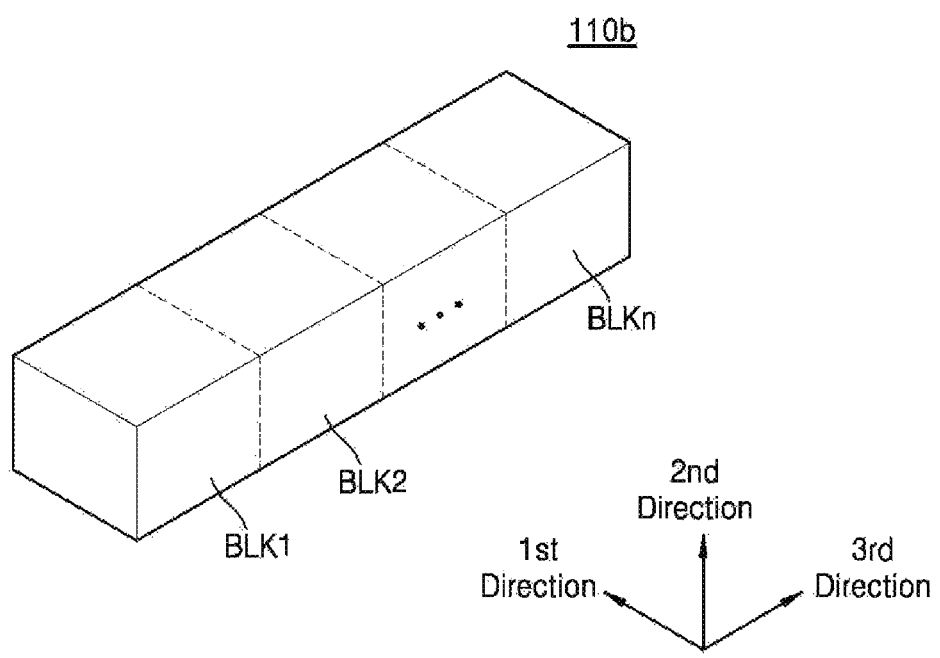
FIG. 5 is a block diagram illustrating a memory cell array of FIG. 1.

FIG. 5 is a block diagram illustrating the memory cell array 110 of FIG. 1. Referring to FIG. 5, the memory cell array 110 may include a plurality of memory blocks BLK, for example, memory blocks BLK1 to BLKn, each of which may have a 3-dimensional (3D) structure (or a vertical structure). In one exemplary embodiment, each of the memory blocks BLK may include 3D structures that extend in a plurality of directions (e.g., x, y, and z). For example, each of the memory blocks BLK may include a plurality of NAND cell strings that extend in a z direction.

Each of the NAND cell strings may be connected to a bit line BL, a string selection line SSL, a ground selection line GSL, word lines WL, and a common source line CSL. That is, each of the memory blocks BLK may be connected to a plurality of bit lines BL, a plurality of string selection lines SSL, a plurality of ground selection lines GSL, a plurality of word lines WL, and the common source line CSL. The memory blocks BLK1 to BLKb will now be described in further detail with reference to FIG. 6.

Figure 6:
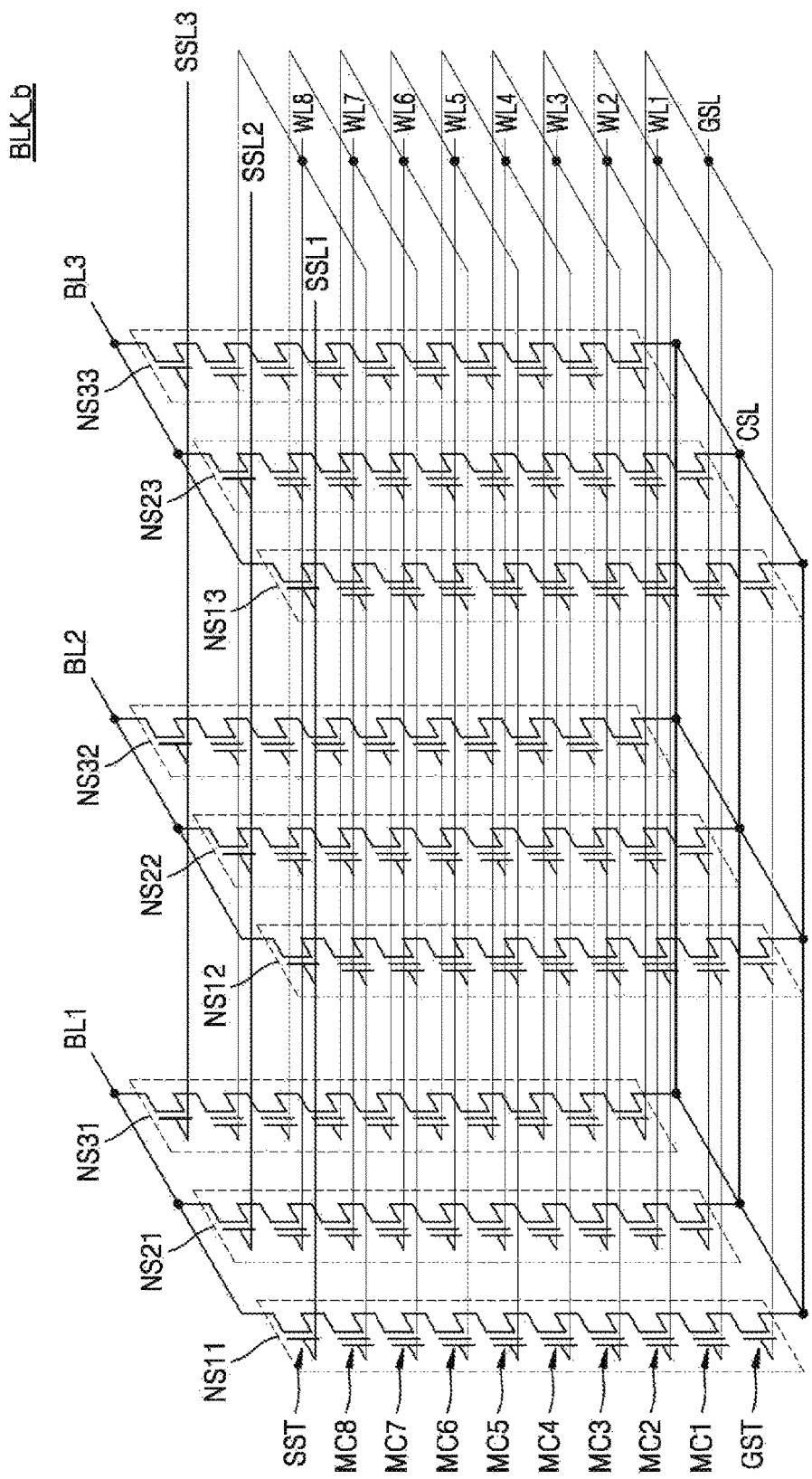
FIG. 6 is a circuit diagram illustrating a memory block of FIG. 5, according to an embodiment of the inventive concept.

FIG. 6 is a circuit diagram illustrating an example BLK_b of the memory block of FIG. 5.

Referring to FIG. 6, a first memory block BLK_b may be a vertical NAND (VNAND) flash memory, and each of the memory blocks BLK1 to BLKn shown in FIG. 5 may be embodied as shown in FIG. 6. The first memory block BLK_b may include a plurality of NAND strings (e.g., NS11 to NS33), a plurality of word lines (e.g., WL1 to WL8), a plurality of bit lines (e.g., BL1 to BL3), a ground selection line GSL, a plurality of string selection lines (e.g., SSL1 to SSL3), and a common source line CSL. Here, the number of NAND strings, the number of word lines, the number of bit lines, the number of ground selection lines, and the number of string selection lines may be variously changed according to exemplary embodiments.

The NAND strings NS11 to NS33 may be connected between the bit lines BL1 to BL3 and the common source line CSL. Each of the NAND strings, for example, the NAND string NS11, may include a string selection transistor SST, a plurality of memory cells MC1 to MC8, and a ground selection transistor GST, which are connected in series. The string selection transistor SST or the ground selection transistor GST may have the same cell structure as or a similar cell structure as the plurality of memory cells MC1 to MC8. The string selection transistor SST or the ground selection transistor GST may be programmed to have a predetermined threshold voltage and used as a transistor. However, the inventive concept is not limited thereto. Alternatively, the string selection transistor SST or the ground selection transistor GST may have a different cell structure from the plurality of memory cells MC1 to MC8 according to a manufacturing method.

The NAND strings NS11, NS21, and NS31 may be provided between the first bit line BL1 and the common source line CSL, and the NAND strings NS12, NS22, and NS32 may be provided between the second bit line BL2 and the common source line CSL. Also, the NAND strings NS13, NS23, and NS33 may be provided between the third bit line BL3 and the common source line CSL. Each of the NAND strings, for example, the NAND string NS11, may include a string selection transistor SST, a plurality of memory cells MC1 to MC8, and a ground selection transistor GST, which may be connected in series. Hereinafter, the NAND string will be referred to as a string for brevity.

Strings connected in common to one bit line may constitute one column. For example, strings NS11, NS21, and NS31 connected in common to the first bit line BL1 may correspond to a first column, strings NS12, NS22, and NS32 connected in common to the second bit line BL2 may correspond to a second column. Also, strings NS13, NS23, and NS33 connected in common to the third bit line BL3 may correspond to a third column.

Strings connected to one string selection line may constitute one row. For example, the strings NS11, NS12, and NS13 connected to the first string selection line SSL1 may correspond to a first row, and the strings NS21, NS22, and NS23 connected to the second string selection line SSL2 may correspond to a second row. The strings NS31, NS32, and NS33 connected to the third string selection line SSL3 may correspond to a third row.

The string selection transistors SST may be connected to the string selection lines SSL1 to SSL3. The plurality of memory cells MC1 to MC8 may be respectively connected to the word lines WL1 to WL8 corresponding thereto. The ground selection transistors GST may be connected to the ground selection line GSL. The string selection transistors SST may be connected to the bit line BL corresponding thereto, and the ground selection transistors GST may be connected to the common source line CSL.

Word lines (e.g., WL1) disposed at the same level may be connected in common, and the string selection lines SSL1 to SSL3 disposed at the same level may be separated from one another. A plurality of NAND strings connected to one of the plurality of string selection lines SSL1 to SSL3, for example, NAND strings NS11, NS12, and NS13 or a plurality of memory cells connected to the first string selection line SSL1 may be referred to as a plane PLANE. When the first string selection line SSL1 is selected and a program voltage is applied to the first word line WL1, memory cells that are included in the NAND strings NS11, NS12, and NS13 of a first row and connected to the first word line WL1 may be programmed Thus, a program operation may be performed on each plane PLANE in a unit of a page corresponding to a word line.

Figure 7:
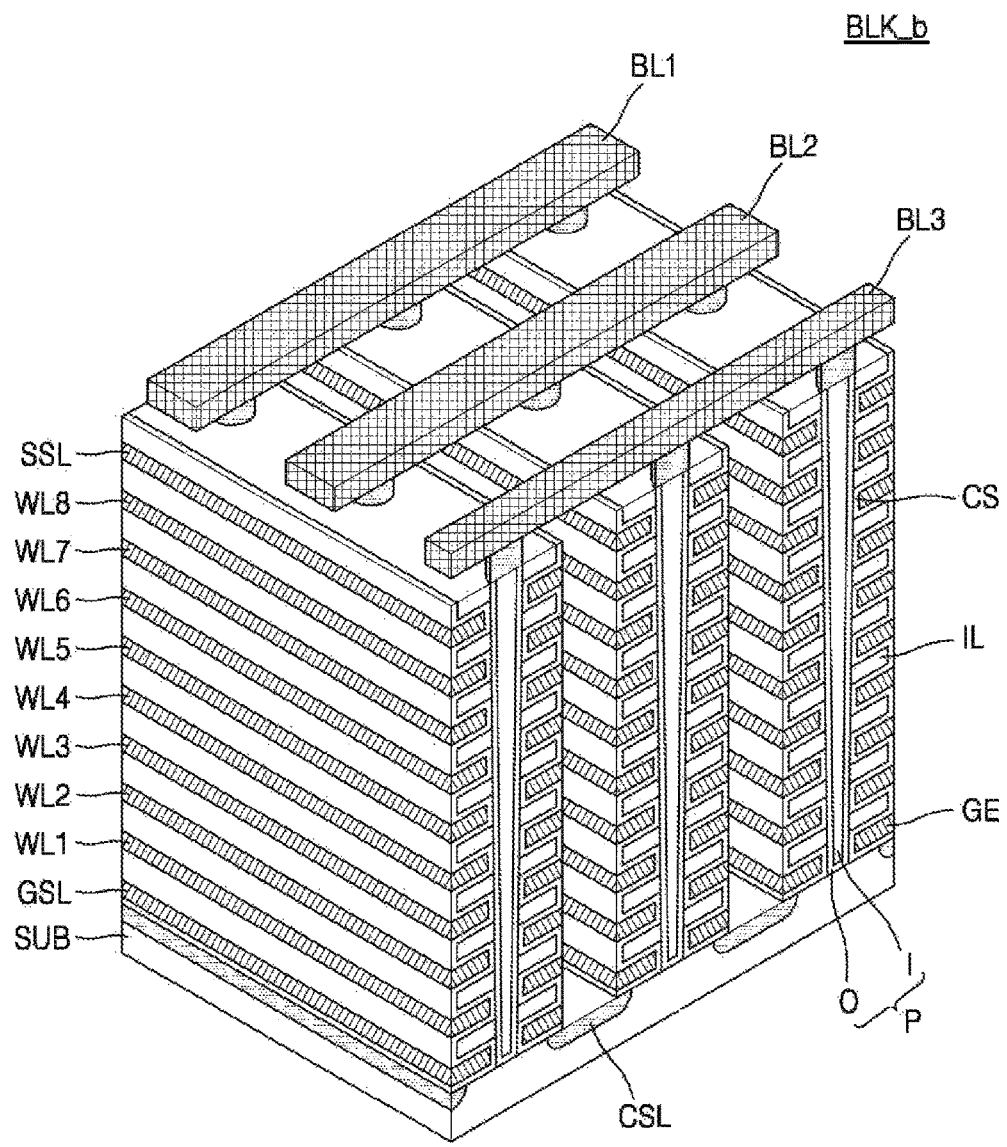
FIG. 7 is a perspective view illustrating the memory block corresponding to the circuit diagram of FIG. 6.

FIG. 7 is a perspective view illustrating a memory block BLK_b corresponding to the circuit diagram of FIG. 6.

Referring to FIG. 7, the memory block BLK_b is formed in a vertical direction to a substrate SUB. A common source line CSL is disposed in the substrate SUB, and a plurality of gate electrodes GE and a plurality of insulating layers IL are alternately stacked on the substrate SUB. Also, a charge storage layer CS may be is formed between the gate electrodes GE and the insulating layers IL.

When the gate electrodes GE and the insulating layers IL that are alternately stacked are vertically patterned, pillars P are formed. Each of the pillars P may have a V shape. Each of the pillars P are formed through the gate electrodes GE and the insulating layers IL and connected to the substrate SUB. An outer portion O of each of the pillars P is formed of a semiconductor material and functions as a channel region. An inner portion I of each of the pillars P is formed of an insulating material, such as silicon oxide.

The gate electrodes GE of the memory block BLK_b are respectively connected to a ground selection line GSL, a plurality of word lines WL1 to WL8, and a string selection line SSL. Also, the pillars P of the memory block BLK_b are connected to a plurality of bit lines BL1 to BL3. Although FIG. 7 illustrates a case in which the memory block BLK_b includes two selection lines GSL and SSL, eight word lines WL1 to WL8, and three bit lines BL1 to BL3, the memory block BLK_b may actually include more or fewer selection lines, more or fewer word lines, and more or fewer bit lines.

Figure 8A:
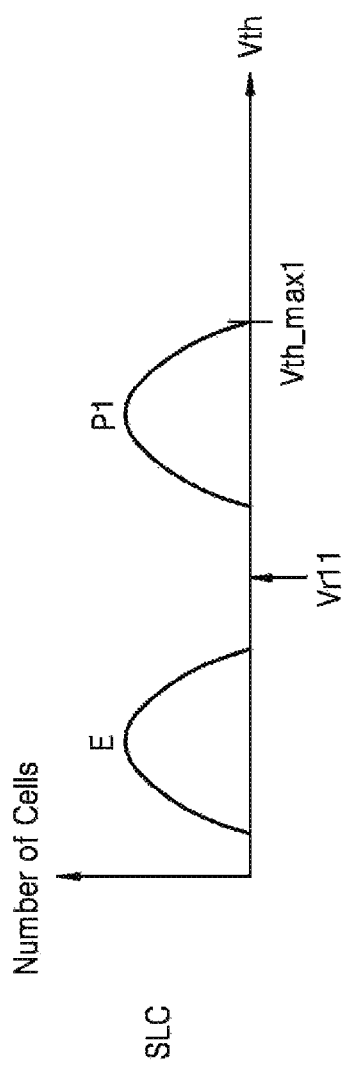
Figure 8C:
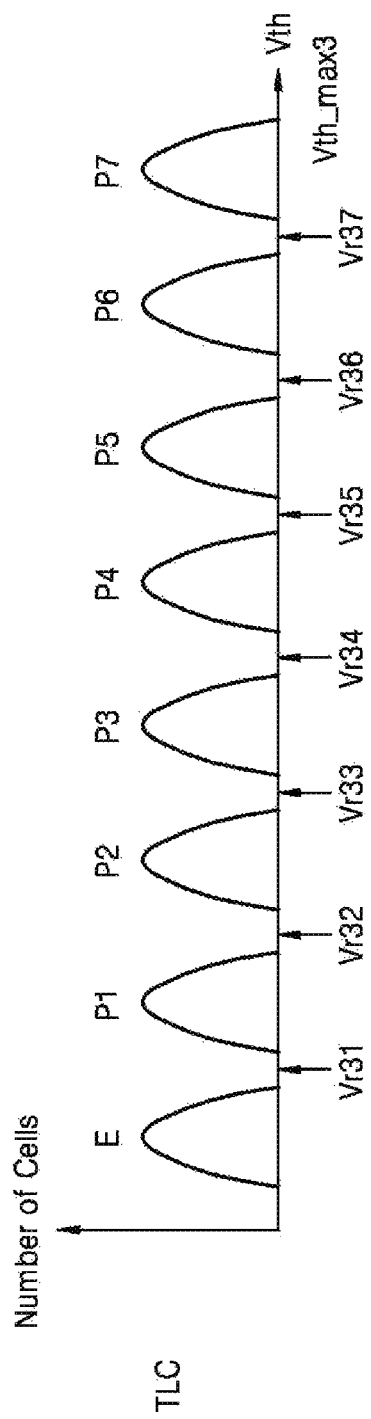

FIGS. 8A, 8B and 8C are graphs showing distributions of memory cells relative to a threshold voltage after the programming of a memory device is finished. FIG. 8A shows a case in which the memory cells are single-level cells, and FIG. 8B shows a case in which the memory cells are multi-level cells. Also, FIG. 8C shows a case in which the memory cells are triple-level cells.

In FIGS. 8A to 8C, an abscissa denotes a threshold voltage Vth, and an ordinate denotes the number of memory cells MC.

Referring to FIG. 8A, when the memory cell MC is a single-level cell SLC programmed with one bit, the memory cell MC may have one of an erase state E and a first program state P1. A first read voltage Vr11 may have a voltage level between a distribution of memory cells MC having the erase state E and a distribution of memory cells MC having the first program state P1. It may be determined whether the memory cell MC has the erase state E or the first program state P1 based on the first read voltage Vr11.

For example, when the first read voltage Vr11 is applied to a control gate of the memory cell MC, the memory cell MC having the erase state E may be turned on, while the memory cell MC having the first program state P1 may be turned off. When the memory cell MC is turned on, current may flow through the memory cell MC. When the memory cell MC is turned off, current may not flow through the memory cell MC. Accordingly, data stored in the memory cell MC may be determined depending on whether the memory cell MC is turned on or off.

In an embodiment of the inventive concept, when the memory cell MC is turned on with application of the first read voltage Vr11, it may be determined that data '1' is stored. When the memory cell MC is turned off, it may be determined that data '0' is stored. However, the inventive concept is not limited thereto. In another exemplary embodiment, when the memory cell MC is turned on with application of a first read voltage Vr11, it may be determined that data '0' is stored. When the memory cell MC is turned off, it may be determined that data '1' is stored. Thus, assignment of a logic level of data may be changed according to exemplary embodiments.

Referring to FIG. 8B, when the memory cell MC is a multi-level cell MLC that is programmed with 2 bits, the memory cell MC may have one of an erase state E, a first program state P1, a second program state P2, and a third program state P3. In the multi-level cell MLC, an interval between distributions of threshold voltages Vth may be smaller than in the single-level cell SLC. Each of first to third read voltages Vr21, Vr22, and Vr23 may correspond to an initialized default level. It may be determined which of the erase state E and the first to third program states P1 to P3 the memory cell MC has based on first to third read voltage Vr21, Vr22, and Vr23.

Referring to FIG. 8C, when the memory cell MC is a triple-level cell TLC that is programmed with 3 bits, the memory cell MC may have one of an erase state E and first to seventh program states P1 to P7. Each of first to seventh read voltages Vr31 to Vr37 may correspond to an initialized default level. It may be determined which of the erase state E and the first to seventh program states P1 to P7 the memory cell MC has based on first to seventh read voltages Vr31 to Vr37.

As shown in FIGS. 8A to 8C, a maximum threshold voltage Vth_max1 of the single-level cell SLC may be lower than a maximum threshold voltage Vth_max2 of the multi-level cell MLC. Also, the maximum threshold voltage Vth_max2 of the multi-level cell MLC may be lower than a maximum threshold voltage Vth_max3 of the triple-level cell TLC.

Figure 9:
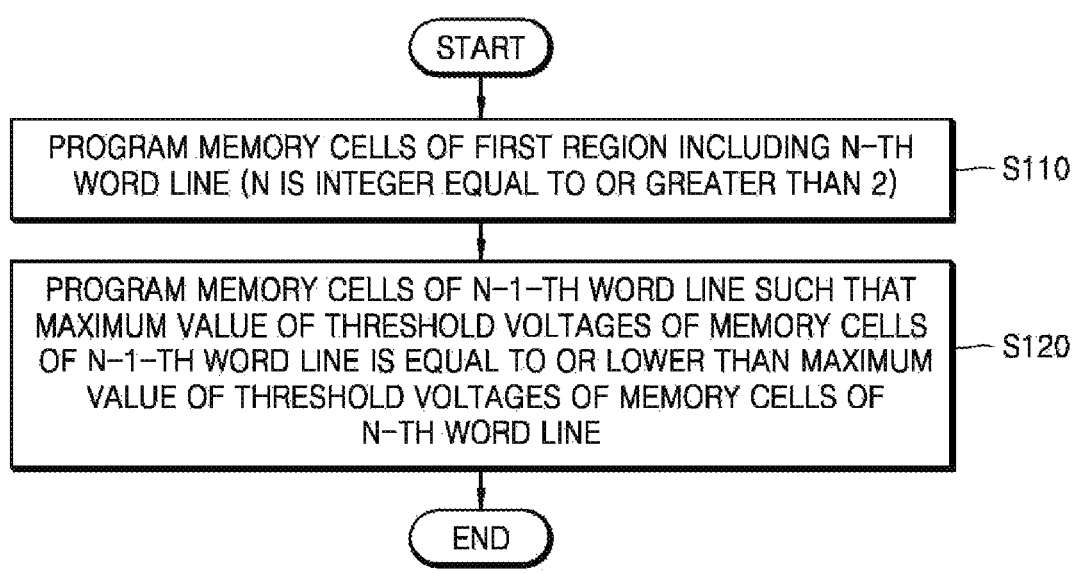
FIG. 9 is a flowchart illustrating a program method according to an embodiment of the inventive concept.

FIG. 9 is a flowchart illustrating a program method according to an embodiment of the inventive concept. The program method shown in FIG. 9 is a method of determining a program order in the program management unit 121 shown in FIGS. 1 and 2.

Referring to FIG. 9, memory cells of a first region including an N-th (N is an integer equal to or greater than 2) word line may be programmed (S110). A memory block BLK may be divided into at least two regions based on the N-th word line. In this case, the N-th word line refers to an N-th word line from the ground selection line (refer to GSL in FIGS. 4 and 6) or the string selection line (SSL in FIGS. 4 and 6). The memory block BLK may include a first region including the N-th word line and a second region including an N−1-th word line. For example, when N is 2, the first region may include at least one word line including a second word line, and the second region may include a first word line. When N is 3, the first region may include at least one different word line including a third word line, and the second region may include a second word line and a first word line. In one exemplary embodiment, the number of word lines included in the first region may be more than the number of word lines included in the second region.

As described with reference to FIGS. 4 and 6, the memory block BLK may be programmed in a unit of a page including memory cells connected to one word line and one string selection line. In this case, according to the present exemplary embodiment, memory cells of the first region may be programmed first. In one exemplary embodiment, the first region may include N-th to K-th (K is an integer that is greater than N) word lines, and memory cells of the N-th to K-th word lines may be programmed in an order in which the N-th to K-th word lines are disposed. For example, the memory cells of the N-th word line to the memory cells of the K-th word line may be sequentially programmed Each of the memory cells of the N-th to K-th word lines may be programmed to a multi-level state. In other words, each of the memory cells of the N-th to K-th word lines may store at least 2 bit data. As such, programming a memory cell to a multi-level state may be referred to as a multi-level program operation. The multi-level program operation may be sequentially started or finished from the N-th word line to the K-th word line. In one exemplary embodiment, when the memory cells of the N-th to K-th word lines are programmed to a multi-level state, a shadow program method may be used. According to the shadow program method, word lines may be non-sequentially selected during the programming of a plurality of pages, and before a multi-level program operation on memory cells of any one word line is finished, another word line may be selected and programmed In other words, a plurality of word lines may be alternately selected and programmed during a multi-level program operation. However, a program operation on each of a plurality of logic pages (e.g., a lowermost page, a middle page, or an uppermost page) that are programmed in memory cells may be sequentially performed from the N-th word line to the K-th word line. Accordingly, the multi-level program operation may be sequentially started or finished from the N-th word line to the K-th word line.

In another exemplary embodiment, word lines may be sequentially selected during the programming of a plurality of pages, and after a multi-level program operation on memory cells of any one word line is finished, another word line may be selected and programmed. Accordingly, the multi-level program operation may be sequentially started and finished from the N-th word line to the K-th word line. In another exemplary embodiment, memory cells of word lines may be programmed in a random order irrespective of the order in which the word lines are disposed.

After the memory cells of the first region are programmed, the memory cells of the N−1-th word line may be programmed (S120), as shown in FIG. 9. In this case, a maximum value of threshold voltages of the memory cells of the N−1-th word line are equal to or lower than a maximum value of threshold voltages of the memory cells of the N-th word line.

According to the present embodiment of the inventive concept, after the memory cells of the N-th word line are programmed, the memory cells of the N−1-th word line are programmed. In this case, the maximum value of threshold voltages of the memory cells of the N−1-th word line are equal to or lower than the maximum value of threshold voltages of the memory cells of the N-th word line.

Figure 10:
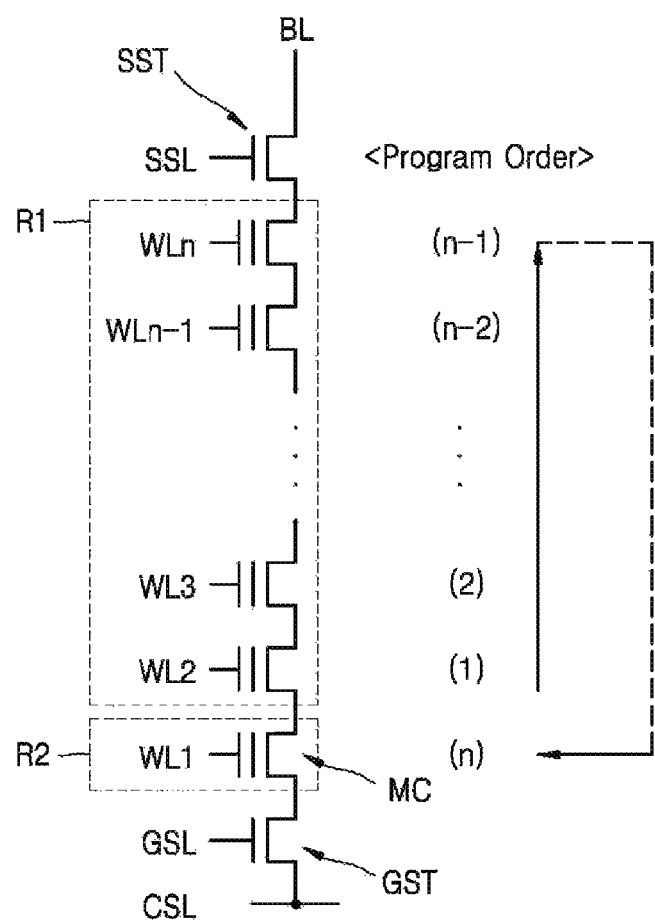
FIG. 10 is a diagram illustrating a program order of memory cells according to the program method of FIG. 9, according to an embodiment of the inventive concept.

FIG. 10 is a diagram illustrating a program order of memory cells according to the program method of FIG. 9, according to an embodiment of the inventive concept. FIG. 10 illustrates a program order of memory cells of a memory block (or a plane of a memory block of a VNAND flash memory). Although FIG. 10 illustrates one string for brevity, a memory block or one plane of the memory block may actually include a plurality of strings selected by one string selection line SSL, and a plurality of memory cells may be connected to one word line. Memory cells of a plurality of strings may be simultaneously programmed in units of word lines, namely, in units of pages.

Referring to FIG. 10, memory cells MC respectively connected to n word lines WL1 to WLn are disposed between a ground selection transistor GST and a string selection transistor SST. Word lines from a word line adjacent to a ground selection line GSL to a word line adjacent to the string selection line SSL are sequentially referred to as first to n-th word lines WL1 to WLn. The memory cells MC are programmed by applying a program voltage to the word lines corresponding thereto. The program voltage may be applied to one of the first to n-th word lines WL1 to WLn. The program voltage may be sequentially applied to the first to n-th word lines WL1 to WLn.

The memory block may be divided into a first region R1 including an N-th word line and a second region R2 including an N−1-th word line. As shown in FIG. 10, it will be assumed that N is 2, the first region R1 includes second to n-th word lines WL2 to WLn, and the second region R2 includes the first word line WL1.

First, memory cells of the first region R1, that is, memory cells of the second to n-th word lines WL2 to WLn, may be programmed.

In one exemplary embodiment, the memory cells of the second to n-th word lines WL2 to WLn may be programmed in an order in which the word lines are disposed. For example, as shown in FIG. 10, after the memory cells of the second memory line WL2 are programmed, the memory cells of the third word line WL3 may be programmed. Thus, the memory cells of the second word line WL2 to the memory cells of the n-th word line WLn may be sequentially programmed. Alternatively, the memory cells of the n-th word line WLn to the memory cells of the second word line WL2 may be sequentially programmed.

In another exemplary embodiment, the memory cells of the second to n-th word lines WL2 to WLn may be programmed in a random order irrespective of the order in which the word lines are disposed.

After the memory cells of the first region R1 are programmed, the memory cells of the first word line WL1 are programmed In this case, a maximum value of threshold voltages of the memory cells of the first word line WL1 are equal to or lower than a maximum value of threshold voltages of the memory cells of the second word line WL2. In one exemplary embodiment, the memory cells of the second word line WL2 and the memory cells of the first word line WL1 may be programmed such that the number of distributions of the threshold voltages of the memory cells of the second word line WL2 is different from the number of distributions of the threshold voltages of the memory cells of the first word line WL1. Thus, the maximum value of the threshold voltages of the memory cells of the first word line WL1 may be lower than the maximum value of the threshold voltages of the memory cells of the second word line WL2. In another exemplary embodiment, the program operation may be performed such that distributions of the threshold voltages of the memory cells of the first word line WL1 are in an equal number to and in a different shape from distributions of the threshold voltages of the memory cells of the second word line WL2. Thus, a maximum value of the threshold voltages of the memory cells of the first word line WL1 may be lower than or equal to a maximum value of the threshold voltages of the memory cells of the second word line WL2. The above-described exemplary embodiments will now be described with reference to FIGS. 11A and 11B.

Figure 11A:
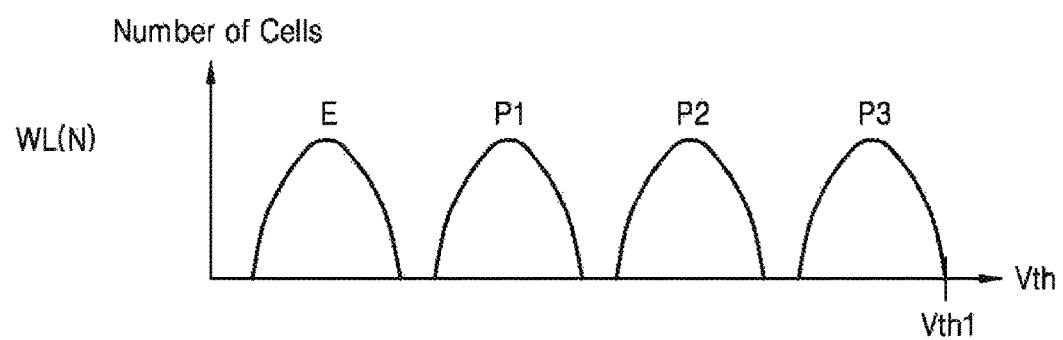
Figure 11A:
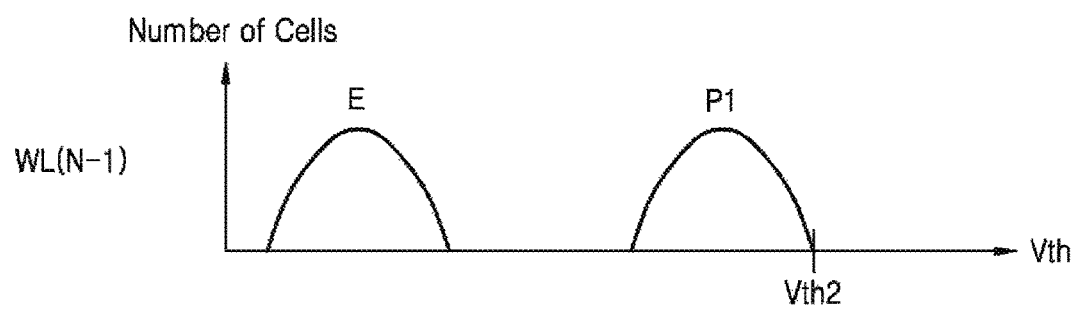

FIGS. 11A and 11B are graphs showing distributions of threshold voltages of memory cells of an N-th word line and an N−1-th word line, according to an embodiment of the inventive concept. FIG. 11A shows a case in which the number of distributions of the threshold voltages of the memory cells of the N-th word line is different from the number of distributions of the threshold voltages of the memory cells of the N−1-th word line. FIG. 11B shows a case in which distributions of the threshold voltages of the memory cells of the N-th word line are in an equal number to and in a different shape from distributions of the threshold voltages of the memory cells of the N−1-th word line.

Referring to FIG. 11A, the memory cells of the N-th word line WL(N) are programmed to a multi-level state, and the memory cells of the N−1-th word line WL(N−1) are programmed to a single level state so that the number of distributions of the threshold voltages of the memory cells of the N-th word line is different from the number of distributions of the threshold voltages of the memory cells of the N−1-th word line. In the case of FIG. 11A, memory cells of a word line WL2 shown in FIG. 10 may be used as multi-level cells, and memory cells of a first word line WL1 may be used as single-level cells. Thus, a maximum value of threshold voltages of the memory cells of the N-th−1 word line WL(N−1) is lower than a maximum value of threshold voltages of the memory cells of the N-th word line WL(N).

FIG. 11A illustrates a case in which the memory cells of the N-th word line WL(N) are programmed to a 2-bit multi-level and the memory cells of the N−1-th word line WL(N−1) are programmed to a single level, but the inventive concept is not limited thereto. The memory cells of the N-th word line WL(N) and the memory cells of the N−1-th word line WL(N−1) may be respectively programmed to a 3-bit multi-level (i.e., a triple level) and a single level, or programmed to a triple level and a 2-bit multi-level.

Referring to FIG. 11B, memory cells of a second word line WL2 (WL(N)) and a first word line WL1 (WL(N−1)) may be programmed to a multi-level. However, by differently determining levels of program voltages applied to the memory cells of the N-th word line and the memory cells of the N−1-th word line and time durations for which the program voltages are applied, the memory cells of the second word line WL2 and the first word line WL1 may be programmed such that the distributions of the memory cells of the N-th word line are different from the distributions of the memory cells of the N−1-th word line. That is, the threshold voltage distributions of the memory cells of the N-th word line have a different shape (are wider for example) than the threshold voltage distributions of the memory cells of the N−1-th word line. Thus, a maximum value Vth2 of threshold voltages of the memory cells of the N−1-th word line WL(N−1) may be equal to or lower than a maximum value Vth1 of threshold voltages of the memory cells of the N-th word line WL(N).

Alternatively, when the memory cells of the second word line WL2 and the first word line WL1 are programmed to have different distributions as shown in FIG. 11B, voltage levels of program verification voltages and read voltages to be applied to the memory cells of the second word line WL2 and the first word line WL1 may be differently determined in a program order or a program voltage level determined by the program management unit (refer to 121 in FIG. 2)

FIG. 11B illustrates a case in which the memory cells of the N-th word line WL(N) and the memory cells of the N−1 word line WL(N−1) are programmed to a triple level, but the inventive concept is not limited thereto. For example, the memory cells of the N-th word line WL(N) and the memory cells of the N−1-th word line WL(N−1) may be programmed to a 2-bit multi-level or a 4-bit multi-level (i.e., a quadruple level).

Referring back to FIG. 10, according to the program method of the present embodiment of the inventive concept, after memory cells of a second word line are programmed, memory cells of a first word line may be programmed such that a maximum value of threshold voltages of the memory cells of the first word line is equal to or lower than a maximum value of threshold voltages of the memory cells of the second word line.

Although FIG. 10 illustrates a case in which a second region R2 includes one word line, the inventive concept is not limited thereto. The second region R2 may further include an N−1-th word line and at least one word line other than the N−1-th word line.

FIG. 12 is a table showing a maximum value of threshold voltages of memory cells, a maximum value of program voltages applied to word lines, and a pass voltage in the program method of FIG. 9.

As described above with reference to FIGS. 9 to 11B, a maximum value Vth2 of threshold voltages of memory cells of an N−1-th word line WL(N−1) may be lower than or equal to a maximum value Vth1 of threshold voltages of memory cells of an N-th word line WL(N).

Thus, during a program operation, a maximum value Vpgm2 of program voltages applied to the N−1-th word line WL(N−1) may be lower than or equal to a maximum value Vpgm1 of program voltages applied to the N-th word line WL(N).

Alternatively, during a program operation on word lines other than the N-th word line WL(N) and the N−1-th word line WL(N−1), a pass voltage Vpass2 applied to the N−1-th word line WL(N−1), namely, a non-selection voltage, may be lower than or equal to a pass voltage Vpass1 applied to the N-th word line WL(N).

Figure 13:
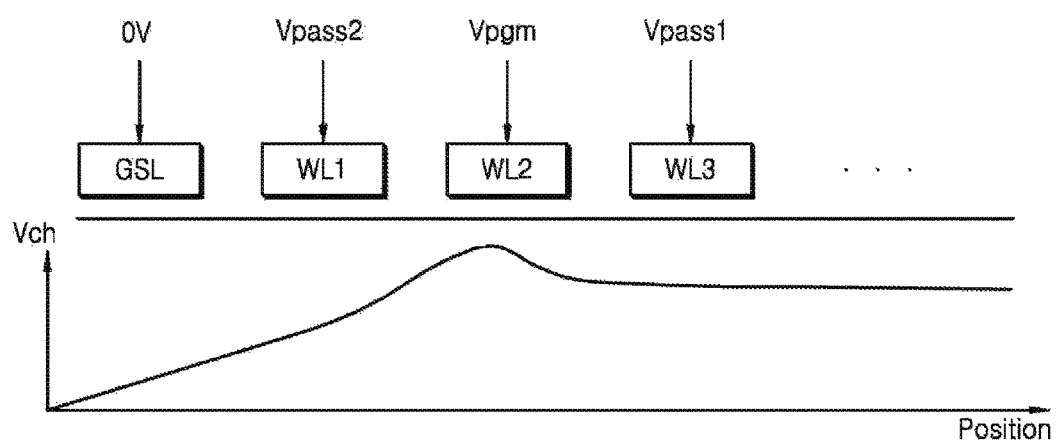
FIG. 13 is a graph of channel voltages of memory cells during a program operation according to an embodiment of the inventive concept.

FIG. 13 is a graph of channel voltages Vch of memory cells during a program operation according to an embodiment of the inventive concept.

Referring to FIG. 13, when memory cells of a selected word line WL2 are programmed by applying a program voltage Vpgm to the selected word line WL2, pass voltages Vpass1 and Vpass2 may be applied to unselected word lines WL1 and WL3. A voltage level of a second pass voltage Vpass2 applied to a first word line WL1 of the unselected word lines may be lower than or equal to a voltage level of a first pass voltage Vpass1 applied to a third word line WL3. A channel voltage of each of memory cells of the word lines WL1, WL2, and WL3 may be boosted due to a capacitance formed between a gate of the memory cells and a channel, and this phenomenon is referred to as channel boosting. Meanwhile, a voltage of about 0V may be applied to a common source line CSL to enable program inhibition. A voltage of about 0V may be applied to a ground selection line GSL to prevent leakage of the channel voltage that is boosted by turning off a ground selection transistor SST.

During a program operation on memory cells, when a sharp variation in channel voltage between the ground selection transistor GST and memory cells adjacent thereto occurs, a hot carrier injection (HCI) phenomenon may occur in the memory cells. Thus, threshold voltages of the memory cells may rise to cause degradation of distributions of the threshold voltages. Furthermore, program disturbance may be caused by undesirably programming the memory cells.

To prevent occurrence of the sharp variation in the channel voltage between the ground selection transistor GST and the memory cells adjacent thereto, an appropriate pass voltage, for example, the second pass voltage Vpass2, may be applied to the first word line WL1 connected to the memory cells adjacent to the ground selection transistor GST. Thus, a channel voltage of memory cells of the first word line WL1 may have a level between a channel voltage of the ground selection transistor GST and channel voltages of the memory cells of the second word line WL2, and a channel voltage may gradually increase from the ground selection transistor GST to the programmed memory cell. Although not shown, a dummy memory cell may be inserted between the ground selection transistor GST and a memory cell adjacent thereto, and a bias voltage may be applied to the dummy memory cell so that a channel voltage of the dummy memory cell has an intermediate level between the channel voltage of the ground selection transistor GST and channel voltages of the memory cells of the first word line WL1.

However, when a memory cell of the first word line that is most adjacent to the ground selection transistor GST is programmed, a level of the channel voltage of the memory cell may depend on whether the memory cell is in an erase state or a program state. If the pass voltage Vpass2 is determined based on a case in which the memory cell is in the erase state, when the memory cell is in the program state, a threshold voltage of the memory cell may be increased so that a memory cell to which the pass voltage Vpass2 is applied may be turned off, and a channel voltage of the memory cell may not be boosted but markedly reduced more than when the memory cells is in the erase state. When a high program voltage Vpgm is applied to a memory cell adjacent to the above-described memory cell, for example a memory cell of the second word line WL2, a sharp variation in channel voltage between the memory cell of the first word line WL1 and the memory cell of the second word line WL2 may occur to cause an HCI phenomenon. Also, distributions of the memory cells of the second word line WL2 may be degraded.

When a level of the pass voltage Vpass2 is increased, even if the memory cell is in the program state, a sharp variation in channel voltage may be prevented by turning on the memory cell. However, when the memory cell is in the erase state, a channel voltage of the memory cell may increase. Thus, a potential difference in channel voltage between the ground selection transistor GST and the memory cell may increase, so that program disturbance may occur in the memory cell that is in the erase state. Thus, when a memory cell adjacent to the ground selection transistor GST is programmed, a channel voltage may depend on whether the memory cell is in an erase state or a program state. Thus, it may be difficult to determine a voltage level of an appropriate second pass voltage Vpass2 to be applied during a subsequent program operation on another adjacent memory cell.

However, according to the program method of the present embodiment of the inventive concept, since the memory cell adjacent to the ground selection transistor GST (e.g., the memory cell of the first word line WL1) is programmed after other memory cells (e.g., the memory cells of the second and third word lines WL2 and WL3) are programmed, the second pass voltage Vpass2 may be determined based on a case in which the memory cell is in an erase state. Also, the program operation may be performed such that a maximum value of threshold voltages of the memory cell is equal to or lower than a maximum value of a threshold voltage of another memory cell adjacent to the memory cell. Thus, a voltage level of the second pass voltage Vpass2 or the program voltage Vpgm applied to the memory cell may be as low as possible. Thus, occurrence of a sharp variation in channel voltage between the ground selection transistor GST and memory cells adjacent thereto may be prevented. As shown in FIG. 13, as a channel voltage gradually increases from the ground selection transistor GST to the programmed memory cell, an HCI phenomenon may be prevented, and reliability of the memory cells may be improved.

Figure 14:
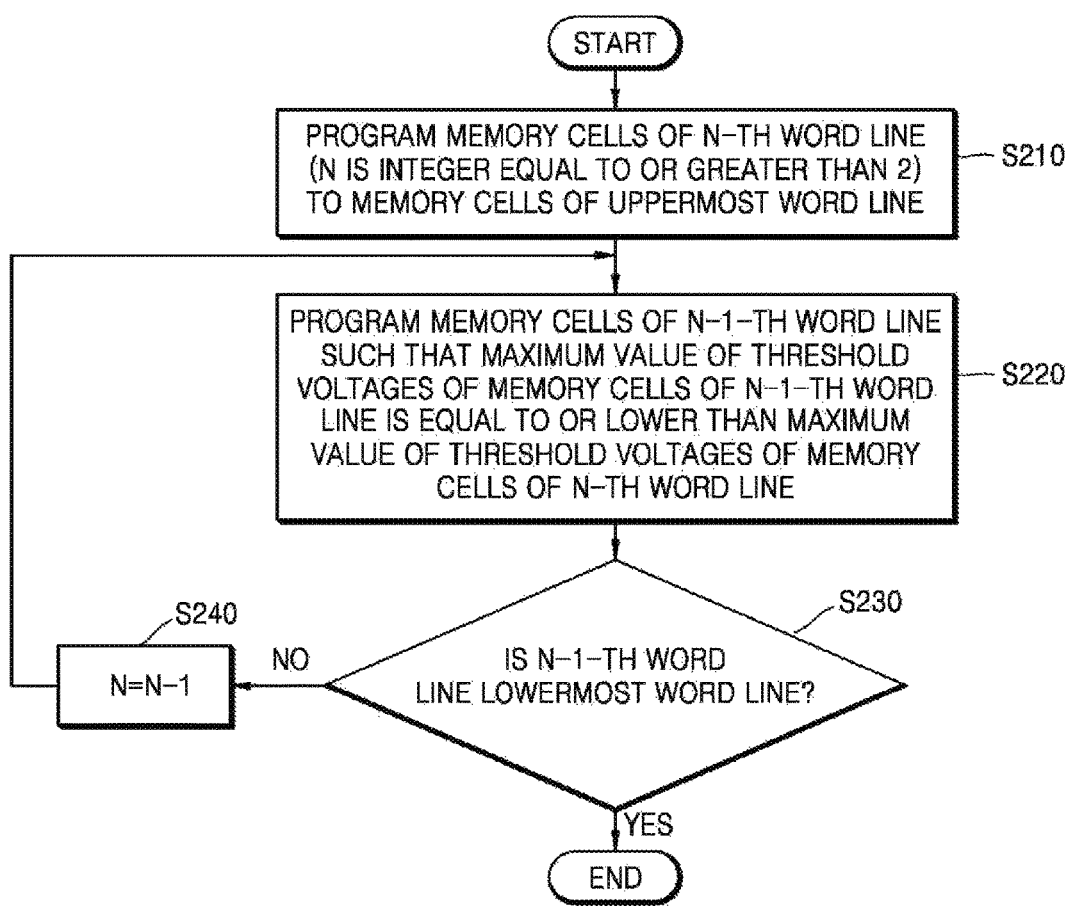
FIG. 14 is a flowchart illustrating a program method according to an embodiment of the inventive concept.

FIG. 14 is a flowchart illustrating a program method according to an embodiment of the inventive concept, which illustrates a modified example of the program method shown in FIG. 9. The program method described with reference to FIG. 9 may be applied to the program method shown in FIG. 14.

Referring to FIG. 14, memory cells of an N-th word line to memory cells of an uppermost word line may be sequentially programmed (S210). For example, when a memory block includes n word lines, memory cells of the N-th word line to memory cells of the n-th word line may be sequentially programmed Subsequently, memory cells of an N−1-th word line may be programmed such that a maximum value of threshold voltages of the memory cells of the N−1-th word line is equal to or lower than a maximum value of threshold voltages of the memory cells of the N-th word line (S220). The program operations S210 and S220 may be similar to the program operations S110 and S120 of FIG. 9, and thus detailed descriptions thereof are omitted.

After the memory cells of the N−1-th word line are programmed, it may be determined whether the N−1-th word line is a lowermost word line (S230). In other words, it may be determined whether the N−1-th word line is a first word line. In this case, if it is determined in step S230 that the first word line is a word line that is most adjacent to a ground selection transistor or a string selection transistor (YES), the programming may be ended.

If it is determined in step S230 that the N−1-th word line is not the lowermost word line (NO), N may be reduced by 1 (S240), and the program operation S220 may be repeated. For example, when N is initially 3, since a (3−1)-th word line (i.e., a second word line) is not the lowermost word line, N may be reduced by 1, and memory cells of the N−1-th word line (i.e., the first word line) may be programmed In this case, the program operation may be performed such that a maximum value of threshold voltages of the memory cells of the first word line is equal to or lower than a threshold voltage of the memory cells of the second word line. Operations S220 to S240 may be repeated so that even the memory cells of the lowermost word line (i.e., the first word line) may be programmed.

Figure 15:
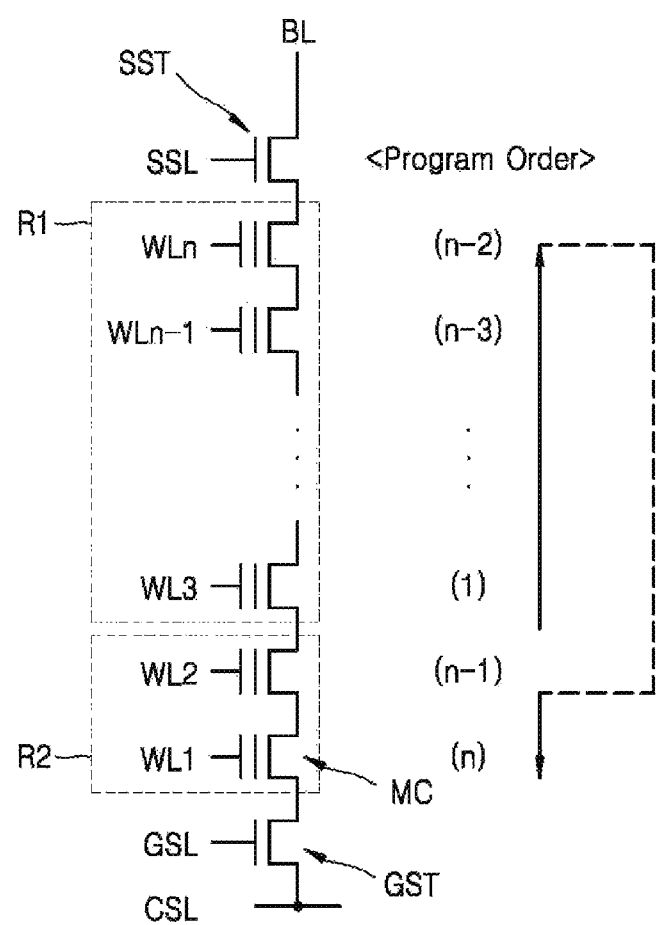
FIG. 15 is a diagram illustrating a program order of memory cells according to the program method of FIG. 14, according to an embodiment of the inventive concept.

FIG. 15 is a diagram illustrating a program order of memory cells according to the program method of FIG. 14, according to an embodiment of the inventive concept.

Referring to FIG. 15, a first region R1 includes third to n-th word lines WL3 to WLn, and a second region R2 includes first and second word lines WL1 and WL2. According to the program method shown in FIG. 14, first of all, memory cells of the first region R1, that is, memory cells of the third to n-th word lines WL3 to WLn are programmed.

In one embodiment of the inventive concept, the memory cells of the third to n-th word lines WL3 to WLn may be programmed in an order in which word lines are disposed. In another exemplary embodiment, the memory cells of the third to n-th word lines WL3 to WLn may be programmed in a random order irrespective of an order in which word lines are disposed.

After the memory cells of the first region R1 are programmed, the memory cells of the second word line WL2 are programmed. In this case, a maximum value of threshold voltages of the memory cells of the second word line WL2 is equal to or lower than a maximum value of threshold voltages of the memory cells of the third word line WL3. In one embodiment of the inventive concept, the memory cells of the second word line WL2 may be programmed to a different level from the memory cells of the third word line WL3. For example, the memory cells of the third word line WL3 may be programmed to a triple level, while the memory cells of the second word line WL2 may be programmed to a multi-level or a single level. Alternatively, the memory cells of the third word line WL3 may be programmed to a multi-level, while the memory cells of the second word line WL2 may be programmed to a single level. In another exemplary embodiment, the memory cells of the second word line WL2 may be programmed to the same level as the memory cells of the third word line WL3 such that a distribution of threshold voltages of the memory cells of the second word line WL2 is different (has different shape for example) from a distribution of threshold voltages of the memory cells of the third word lines WL3. Thus, a maximum value of threshold voltages of the memory cells of the second word line WL2 may be equal to or lower than a maximum value of threshold voltages of the memory cells of the third word line WL3.

After the memory cells of the second word line WL2 are programmed, the memory cells of the first word line WL1 are programmed. A maximum value of threshold voltages of the memory cells of the first word line WL1 is equal to or lower than a maximum value of threshold voltages of the memory cells of the second word line WL2. In one embodiment of the inventive concept, the memory cells of the second word line WL2 may be programmed to a different level from the memory cells of the first word line WL1 so that the maximum value of threshold voltages of the memory cells of the first word line WL1 may be lower than the maximum value of threshold voltages of the memory cells of the second word line WL2. In another exemplary embodiment, the second word line WL2 and the first word line WL1 may be programmed to the same level such that a distribution of threshold voltages of the memory cells of the second word line WL2 is different from a distribution of threshold voltages of the memory cells of the first word line WL1. Thus, the maximum value of threshold voltages of the memory cells of the first word line WL1 may be lower than or equal to the maximum value of threshold voltages of the memory cells of the second word line WL2.

Thus, after the memory cells of the first region R1 are programmed, the memory cells of the second region R2 are programmed In this case, from among the word lines of the second region R2, memory cells of a word line which is most adjacent to the first region R1 to memory cells of a lowermost word line, are sequentially programmed In the memory cells of the second region R2, a maximum value of threshold voltages of memory cells that are programmed are lower than or equal to a maximum value of threshold voltages of memory cells that are previously programmed.

FIG. 16 is a table showing a maximum value of threshold voltages of memory cells, a maximum value of program voltages applied to word lines, and a pass voltage in the program method of FIG. 14.

As described with reference to FIGS. 14 and 15, a maximum threshold voltage Vth2 of memory cells of an N-1-th word line WL(N-1) is lower than or equal to a maximum threshold voltage Vth1 of memory cells of an N-th word line WL(N). Also, a maximum threshold voltage Vth3 of memory cells of an N-2-th word line WL(N-2) is lower than or equal to the maximum threshold voltage Vth2 of the memory cells of the N-1-th word line WL(N-1).

Thus, during a program operation, a maximum program voltage Vpgm2 applied to the N-1-th word line WL(N-1) is lower than or equal to a maximum program voltage Vpgm1 applied to the N-th word line WL(N). A maximum program voltage Vpgm3 applied to the N-2-th word line WL(N-2) is lower than or equal to the maximum program voltage Vpgm2 applied to the N-1-th word line WL(N-1).

Alternatively, during a program operation on memory cells of other word lines, a pass voltage Vpass2 applied to the N-1-th word line WL(N-1) is lower than or equal to a pass voltage Vpass1 applied to the N-th word line WL(N). A pass voltage Vpass3 applied to the N-2-th word line WL(N-2) is lower than or equal to the pass voltage Vpass2 applied to the N-1-th word line WL(N-1).

Figure 17:
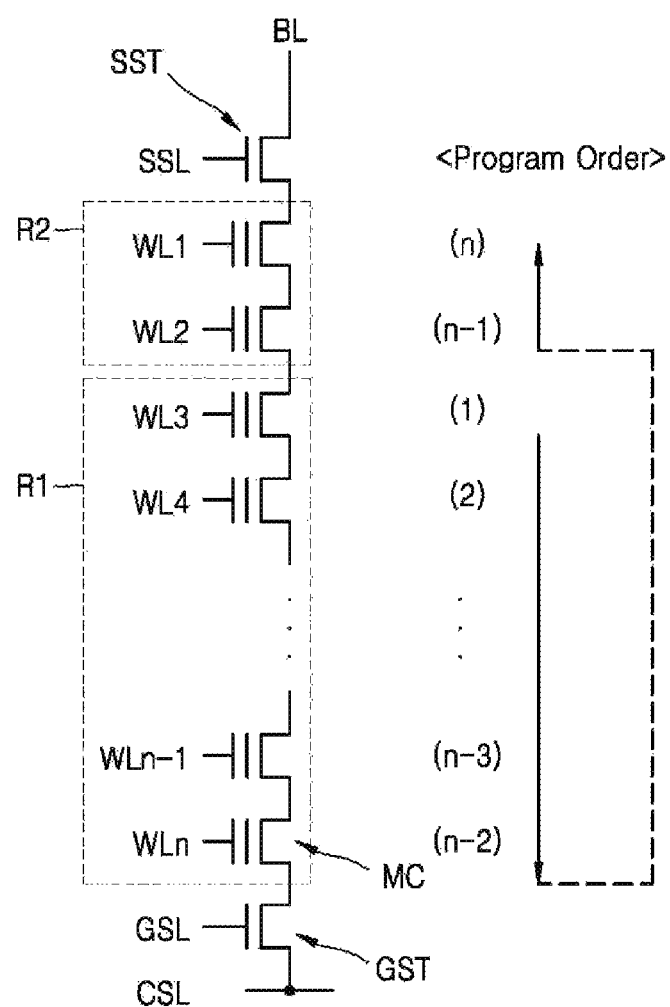
FIG. 17 is a diagram illustrating a program order of memory cells according the program methods shown in FIGS. 9 and 14, according to an embodiment of the inventive concept.

FIG. 17 is a diagram illustrating a program order of memory cells MC according the program methods shown in FIGS. 9 and 14, according to an embodiment of the inventive concept.

Referring to FIG. 17, memory cells MC respectively connected to n word lines WL1 to WLn are disposed between a ground selection transistor GST and a string selection transistor SST. A word line adjacent to a string selection line SSL to a word line adjacent to a ground selection line GSL may be sequentially referred to as first to n-th word lines WL1 to WLn.

After the memory cells of a first region R1 (i.e., memory cells of third to n-th word lines WL3 to WLn) are programmed, memory cells of a second region R2 (i.e., memory cells of the second word line WL2 and the first word line WL1) are programmed In this case, the second word line WL2 and the first word line WL1 are sequentially programmed, and a maximum value of threshold voltages of memory cells of the second word line WL2 and the first word line WL1 may be equal to or lower than a maximum value of threshold voltages of previously programmed memory cells (i.e., memory cells of the third word line WL3 and the second word line WL2).

In FIGS. 10 and 15, a word line adjacent to the ground selection line GSL to a word line adjacent the string selection line SSL are sequentially referred to as first to n-th word lines WL1 to WLn, and a memory cell adjacent to the ground selection transistor GST is programmed finally or last (that is after programming of memory cells of other word lines) according to the corresponding described program methods However, the inventive concept is not limited thereto. In other embodiments of the inventive concept as shown in FIG. 17, a word line adjacent to the string selection line SSL may be referred to a lowermost word line, for example the first word line WL1, and a memory cell adjacent to the string selection transistor SST may be programmed last (after programming of memory cells of other word lines).

Figure 18:
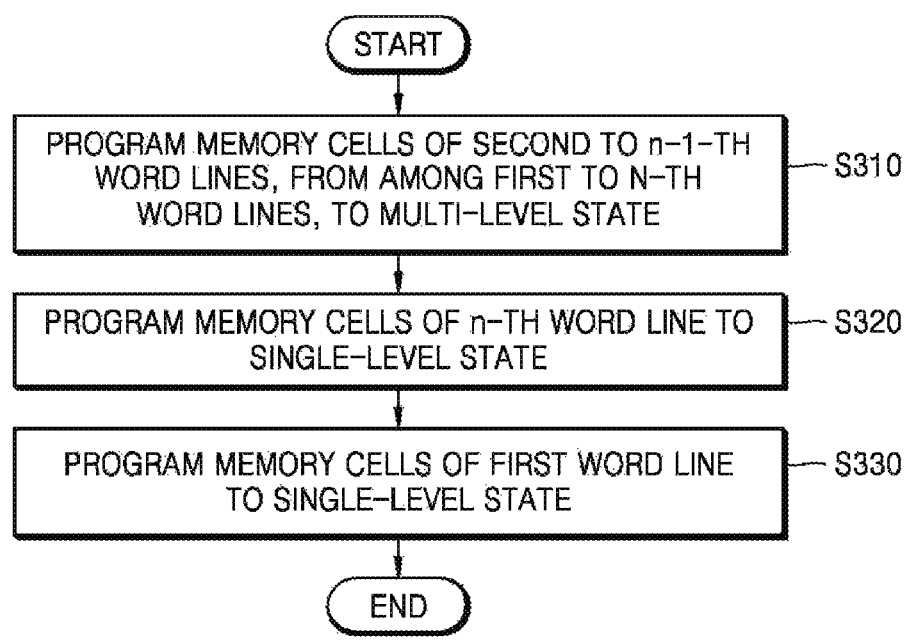
FIG. 18 is a flowchart illustrating a program method according to an embodiment of the inventive concept.

FIG. 18 is a flowchart illustrating a program method according to an embodiment of the inventive concept, which illustrates a modified example of the program method shown in FIG. 9.

Referring to FIG. 18, from among first to n-th word lines disposed between a ground selection line and a string selection line, memory cells of second to n−1-th word lines are programmed to a multi-level state (S310). The memory cells of the second to n−1-th word lines may be sequentially programmed in an order in which the second to n−1-th word lines are disposed, or randomly programmed.

In one embodiment of the inventive concept, the memory cells of the second to n−1-th word lines may be programmed such that the same number of bits of data is stored in the memory cells of the second to n−1-th word lines. For example, all the memory cells of the second to n−1-th word lines may be programmed to a multi-level corresponding to 2-bit data or a triple level corresponding to 3-bit data.

In another exemplary embodiment, the memory cells of the second to n−1-th word lines may be programmed such that different numbers of bits of data are stored in the memory cells of the second to n−1-th word lines. For example, memory cells of at least some word lines of the second to n−1-th word lines may be programmed to a multi-level, while memory cells of other word lines may be programmed to a triple level.

After the memory cells of the second to n−1-th word lines are programmed to a multi-level state, memory cells of the n-th word line are programmed to a single level state (S320), and memory cells of the first word line are programmed to a single level state (S330). Operations S320 and S330 may be performed in reverse order.

According to the present embodiment of the inventive concept, memory cells disposed in an outer portion of a memory string may be programmed to a single level state, and memory cells disposed in an inner portion of the memory string may be programmed to a multi-level state. After multi-level cells are programmed, single-level cells may be programmed.

Figure 19:
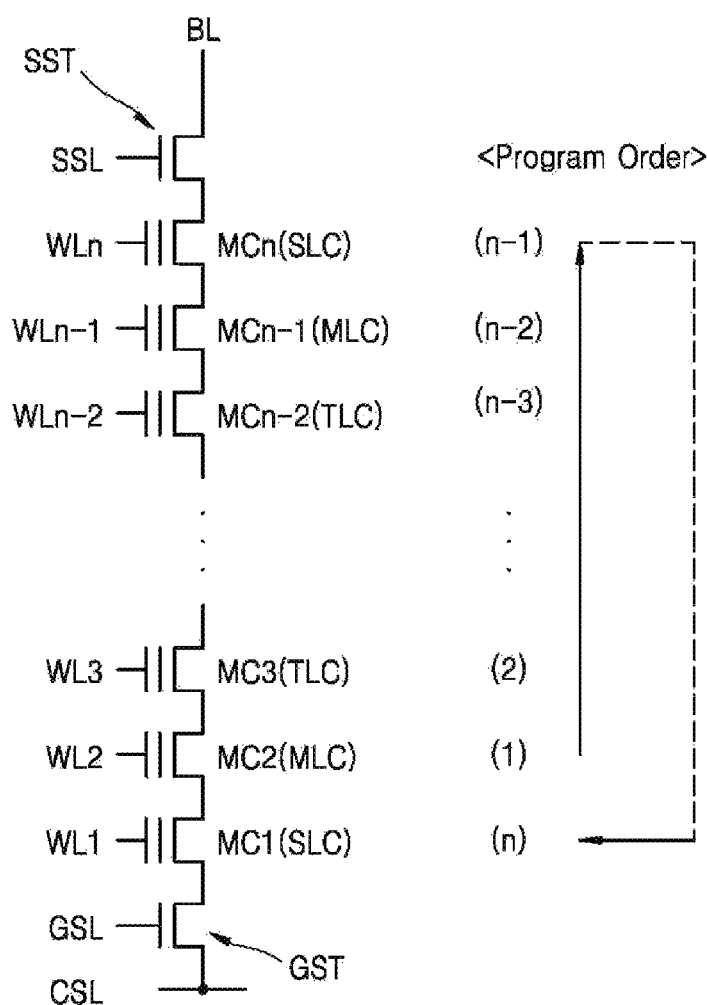
FIG. 19 is a diagram illustrating a program order of memory cells according to the program method of FIG. 18, according to an embodiment of the inventive concept.

FIG. 19 is a diagram illustrating a program order of memory cells according to the program method of FIG. 18, according to an embodiment of the inventive concept.

Referring to FIG. 19, from among a plurality of memory cells MC1 to MCn, a first memory cell MC1 and an n-th memory cell MCn disposed in an outer portion of a string are programmed to a single level state, and a second memory cell MC2 to an n−1-th memory cell MCn−1 disposed in an inner portion of the string are programmed to a multi-level state.

The second memory cell MC2 to the n−1-th memory cell MCn−1 may be included in a first region R1, which is a multi-level cell region configured to store data having at least two bits per memory cell. The first memory cell MC1 and the n-th memory cell MCn may be respectively included in second and third regions R2 and R3, each of which may be a single-level cell region configured to store 1-bit data per memory cell.

As shown in FIG. 19, the second memory cell MC2 and the n−1-th memory cell MCn−1 may be programmed to a multi-level, and a third memory cell MC3 to an n−2-th memory cell MCn−2 may be programmed to a triple level. However, the inventive concept is not limited thereto, and a program operation may be variously changed. For example, all of the second to n−1-th memory cells MC2 to MCn−1 may be programmed to a multi-level or a triple level.

A multi-level program operation may be performed preferentially to a single-level program operation. That is, initially, the second to n−1-th memory cells MC2 to MCn−1 may be programmed to a multi-level. As shown in FIG. 19, the second to n−1-th memory cells MC2 to MCn−1 may be sequentially programmed. Alternatively, the second to n−1-th memory cells MC2 to MCn−1 may be programmed in a random order. Subsequently, the n-th memory cell MCn may be programmed to a single-level, and the first memory cell MC1 may be finally programmed to a single level.

Figure 20:
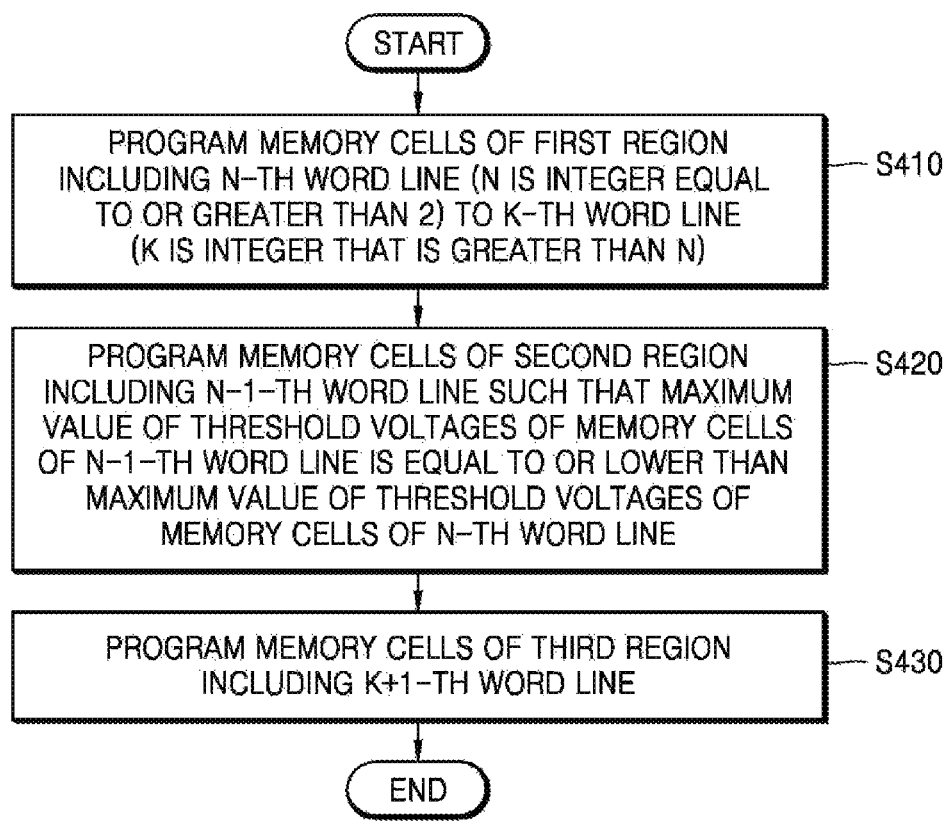
FIG. 20 is a flowchart illustrating a program method according to an embodiment of the inventive concept.

FIG. 20 is a flowchart illustrating a program method according to an embodiment of the inventive concept, which is a modified example of the program method shown in FIG. 9.

Referring to FIG. 20, memory cells of a first region including an N-th (N is an integer equal to or greater than 2) word line to a K-th (K is an integer that is greater than N) word line are programmed (S410). A memory block BLK may be divided into at least three regions based on the N-th word line and the K-th word line. In this case, the N-th word line and the K-th word line respectively refer to N-th and K-th word lines from the ground selection line (SSL in FIGS. 4 and 6) or the string selection line (SSL in FIGS. 4 and 6). The memory block BLK may include a first region including the N-th word line to the K-th word line, a second region including an N−1-th word line, and a third region including a K+1-th word line. For example, when N is 2 and K is 4, the first region may include second to fourth word lines, the second region may include a first word line, and the third region may include a fifth word line or include the fifth word line and at least one word line other than the fifth word line.

When N is 3 and K is 4, the first region may include third and fourth word lines, the second region may include first and second word lines, and the third region may include a fifth word line or include the fifth word line and at least one word line other than the fifth word line. In one exemplary embodiment, the number of word lines included in the first region may be greater than the number of word lines included in the second region.

In one embodiment of the inventive concept, memory cells of the N-th word line to the K-th word line of the first region may be programmed in an order in which the word lines are disposed. For example, the memory cells of the N-th word line to the memory cells of the K-th word line may be sequentially programmed in units of pages connected to the word lines. In another exemplary embodiment, the memory cells of the word lines may be programmed in a random order irrespective of an order in which the word lines are disposed.

After the memory cells of the first region are programmed, memory cells of the second region including the N−1-th word line are programmed (S420). In this case, the program operation is performed such that a maximum value of threshold voltages of the memory cells of the N−1-th word line is equal to or lower than a maximum value of threshold voltages of memory cells of the N-th word line. The memory cells of the N−1-th word line to memory cells of a lowermost word line may be sequentially programmed.

After the memory cells of the second region are programmed, memory cells of the third region including the K+1-th word line are programmed (S430). When memory cells of a plurality of word lines of the third region are programmed, memory cells of the K+1-th word line of the plurality of word lines are sequentially programmed in a disposed order. In one embodiment of the inventive concept, the program operation may be performed such that a maximum value of threshold voltages of the memory cells of the K+1-th word line is equal to a maximum value of threshold voltages of the memory cells of the K-th word line. In another exemplary embodiment, the program operation may be performed such that the maximum value of threshold voltages of the memory cells of the K+1-th word line is equal to the maximum value of threshold voltages of the memory cells of the N−1-th word line.

Figure 21:
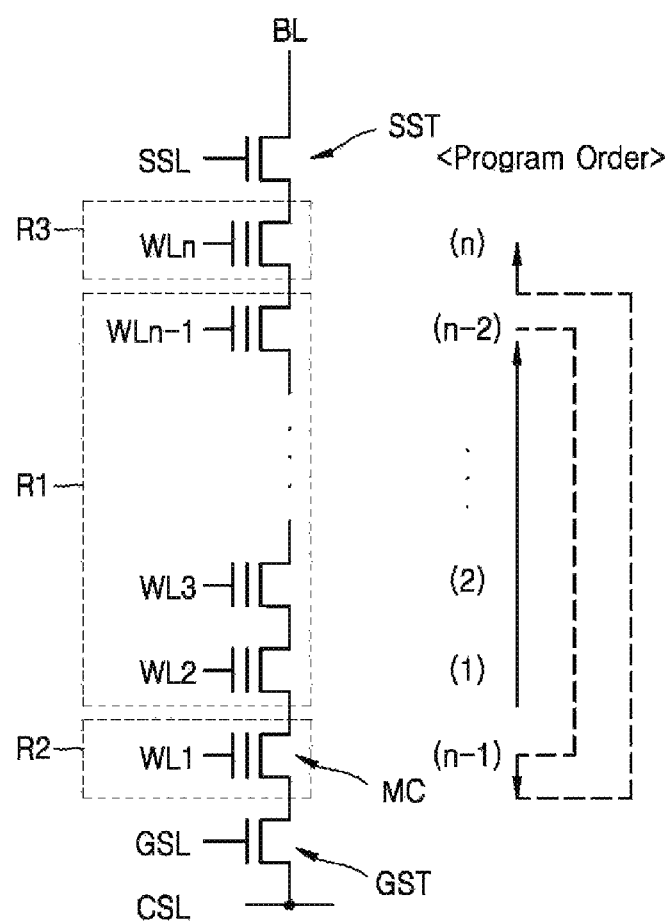
FIG. 21 is a diagram illustrating a program order of memory cells according to the program method of FIG. 20, according to an embodiment of the inventive concept.

FIG. 21 is a diagram illustrating a program order of memory cells according to the program method of FIG. 20, according to an embodiment of the inventive concept.

Referring to FIG. 21, a memory block may include first to third regions R1, R2, and R3. As shown in FIG. 21, the first region R1 includes memory cells of second to n−1-th word lines WL2 to WLn−1, the second region R2 may include memory cells of a first word line WL1, and the third region R3 may include memory cells of an n-th word line WLn. However, the inventive concept is not limited thereto, and the number of word lines included in each of the second and third regions R2 and R3 may be variously changed.

According to the program method of FIG. 20, first of all, the memory cells of the first region R1, that is, the memory cells of the second to n−1-th word lines WL2 to WLn−1, are programmed.

In one exemplary embodiment of the inventive concept, the memory cells of the second word line WL2 to the n−1-th word line WLn−1 may be programmed in an order in which the word lines are disposed. As shown in FIG. 21, the memory cells of the second word line WL2 to the memory cells of the n−1-th word line WLn−1 may be sequentially programmed. Alternatively, the memory cells of the n−1-th word line WLn−1 to the memory cells of the second word line WL2 may be sequentially programmed.

In another exemplary embodiment, the memory cells of the second to n−1-th word lines WL2 to WLn−1 may be programmed in a random order irrespective of an order in which the word lines are disposed.

After the memory cells of the first region R1 are programmed, the memory cells of the first word line WL1 of the second region R2 are programmed In this case, a maximum value of threshold voltages of the memory cells of the first word line WL1 is equal to or lower than a maximum value of threshold voltages of the memory cells of the second word line WL2. In one embodiment of the inventive concept, the memory cells of the first word line WL1 may be programmed to a lower level than the memory cells of the second word line WL2. In another exemplary embodiment, the memory cells of the first word line WL1 and the memory cells of the second word line WL2 may be programmed to the same level but have different distributions from each other. Thus, a maximum value of threshold voltages of the memory cells of the first word line WL1 may be equal to or lower than a maximum value of threshold voltages of the memory cells of the second word line WL2.

After the memory cells of the second region R2 are programmed, memory cells of an n-th word line WLn of the third region R3 are programmed In one embodiment of the inventive concept, a maximum value of threshold voltages of the memory cells of the n-th word line WLn may be equal to a maximum value of threshold voltages of the threshold voltages of the second word line WL2. In another exemplary embodiment, a maximum value of threshold voltages of the memory cells of the n-th word line WLn may be equal to a maximum value of threshold voltages of the threshold voltages of the first word line WL1.

FIGS. 22A and 22B are tables showing a maximum value of threshold voltages of memory cells, a maximum value of program voltages applied to word lines, and a pass voltage in the program method of FIG. 20.

Referring to FIG. 22A, a maximum threshold voltage Vth2 of memory cells of an N−1-th word line WL(N−1) is lower than or equal to a maximum threshold voltage Vth1 of memory cells of an N-th word line WL(N). In addition, a maximum threshold voltage Vth3 of memory cells of a K+1-th word line WL(K+1) is equal to the maximum threshold voltage Vth1 of the memory cells of the N-th word line WL(N).

Thus, during a program operation, a maximum program voltage Vpgm2 applied to the N−1-th word line WL(N−1) is lower than or equal to a maximum program voltage Vpgm1 applied to the N-th word line WL(N). A maximum program voltage applied to a K+1-th word line WL(K+1) is equal to the maximum program voltage Vpgm1 applied to the N-th word line WL(N).

Alternatively, during a program operation, a pass voltage Vpass2 applied to the N−1-th word line WL(N−1) is lower than or equal to a pass voltage Vpass1 applied to the N-th word line WL(N). A pass voltage Vpass3 applied to a K+1-th word line WL(K+1) is equal to the pass voltage Vpass1 applied to the N-th word line WL(N).

Referring to FIG. 22B, a maximum threshold voltage Vth2 of memory cells of the N−1-th word line WL(N−1) is lower than or equal to a maximum threshold voltage Vth1 of memory cells of the N-th word line WL(N). In addition, a maximum threshold voltage Vth3 of memory cells of the K+1-th word line WL(K+1) is equal to the maximum threshold voltage Vth2 of the memory cells of the N−1-th word line WL(N−1).

Thus, during a program operation, a maximum program voltage Vpgm2 applied to the N−1-th word line WL(N−1) is lower than or equal to a maximum program voltage Vpgm1 applied to the N-th word line WL(N). A maximum program voltage Vpgm3 applied to the K+1-th word line WL(K+1) is equal to the maximum program voltage Vpgm2 applied to the N−1-th word line WL(N−1).

Alternatively, during a program operation, a pass voltage Vpass2 applied to the N−1-th word line WL(N−1) is lower than or equal to a pass voltage Vpass1 applied to the N-th word line WL(N). A pass voltage Vpass3 applied to the K+1-th word line WL(K+1) is equal to the pass voltage Vpass2 applied to the N−1-th word line WL(N−1).

Figure 23:
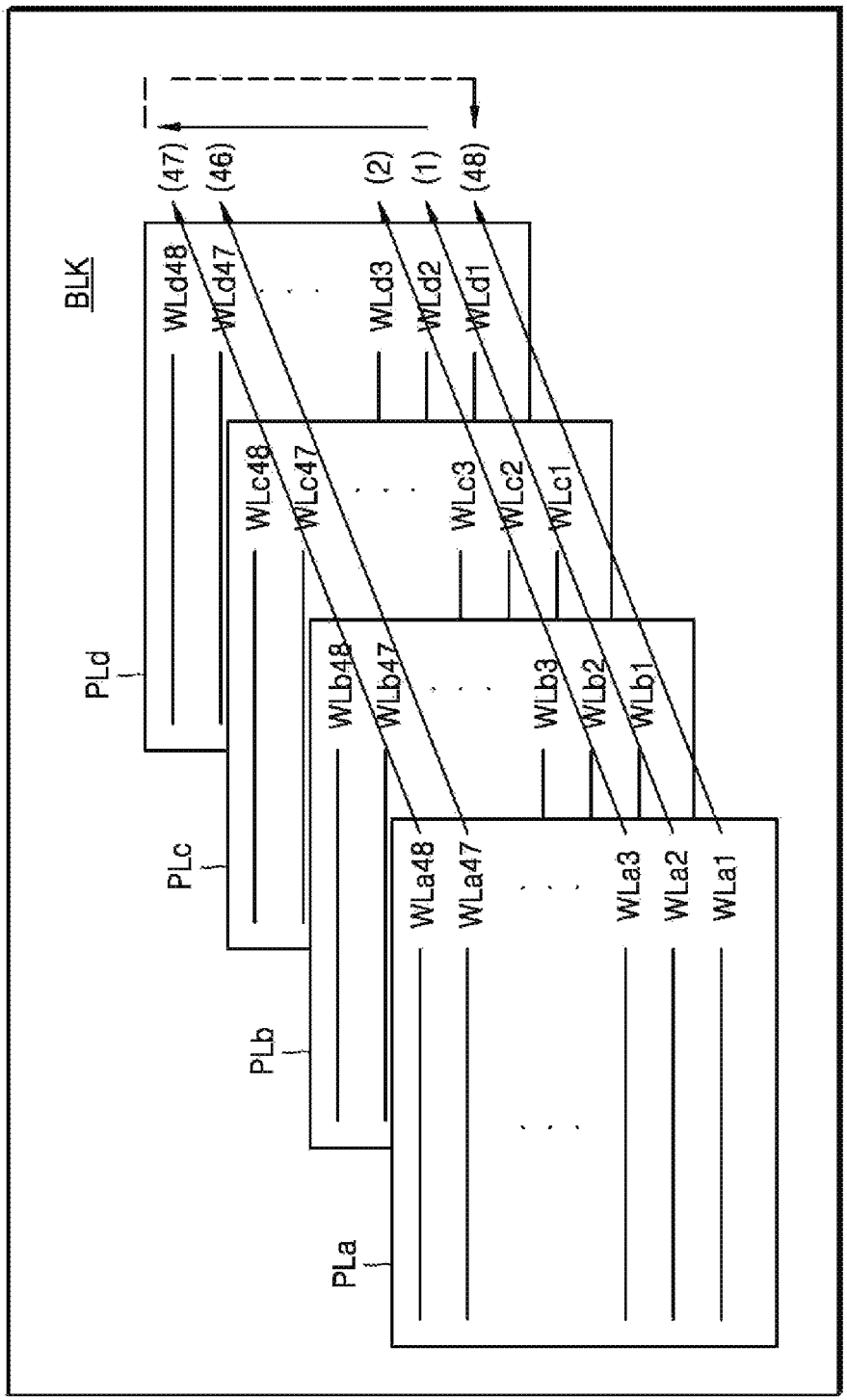
FIG. 23 is a diagram illustrating a program method according to an embodiment of the inventive concept.

FIG. 23 is a diagram illustrating a program method according to an embodiment of the inventive concept.

The program method according to the present embodiment may be a method of programming the memory block (refer to BLK_b in FIG. 6) of a VNAND flash memory device including a plurality of planes. The program method described above with reference to FIGS. 3 to 22B may be applied to the present embodiment.

In the VNAND flash memory device, a memory block BLK may include a plurality of planes PLa to PLd. Referring to FIG. 6, each of the planes PLa to PLd may include a plurality of NAND strings connected to one string line of a plurality of string lines (refer to SSL1, SSL2, and SSL3 of FIG. 6). For example, a first row of NAND strings NS11, NS12, and NS13 connected to a first string selection line SSL1 may constitute one plane, and a second row of NAND strings NS21, NS22, and NS23 connected to a second string selection line SSL2 may constitute another plane.

As described above with reference to FIGS. 3 to 22B, memory cells of a first region including an N-th word line are programmed, and then memory cells of an N−1-th word line are programmed In this case, after all memory cells of the plurality of planes PLa to PLd are programmed in one word line, memory cells of the next word line may be programmed.

Referring to FIG. 23, the memory block BLK may include four planes PLa, PLb, PLc, and PLd, each of which may include 48 word lines. In the respective planes PLa, PLb, PLc, and PLd, second word lines WLa2, WLb2, WLc2, and WLd2 to 48-th word line WLa48, WLb48, WLc48, and WLd48 may be included in the first region, and first word lines WLa1, WLb1, WLc1, and WLd1 may be included in a second region. As shown in FIG. 23, memory cells of the second word lines WLa2, WLb2, WLc2, and WLd3 to the 48-th word lines WLa48, WLb48, WLc48, and WLd48 may be sequentially programmed In this case, memory cells of one word line may be sequentially programmed in units of planes. For example, as shown in FIG. 23, memory cells of the second word lines WLa2, WLb2, WLc2, and WLd3 of a plurality of planes PLa, PLb, PLc, and PLd may be sequentially programmed, and memory cells of third word lines WLa3, WLb3, WLc3, and WLd3 of the plurality of planes PLa, PLb, PLc, and PLd may be then sequentially programmed FIG. 23 illustrates a case in which the first to fourth planes PLa to PLd are sequentially programmed in an order in which the first to fourth planes PLa to PLd are disposed, but the inventive concept is not limited thereto. For example, the fourth to first planes PLd to PLa may be sequentially programmed in an order in which the fourth to first planes PLd to PLa are disposed, or programmed in a random order.

Thus, in the plurality of planes PLa, PLb, PLc, and PLd, after the second word lines WLa2, WLb2, WLc2, and WLd2 to the 48-th word lines WLa48, WLb48, WLc48, and WLd48 are programmed, memory cells of the first word lines WLa1, WLb1, WLc1, and WLd1 may be sequentially programmed in units of planes.

The method of programming the memory block BLK of the VNAND flash memory device has been described with reference to FIG. 23 as an example of a method of programming a VNAND flash memory device, but the inventive concept is not limited thereto. The program order of the memory cells of the word lines of the plurality of planes PLa, PLb, PLc, and PLd may be variously modified without departing from a program method in which the memory cells of the N−1-th word line are programmed after the memory cells of the first region including the N-th word line are programmed.

Figure 24:
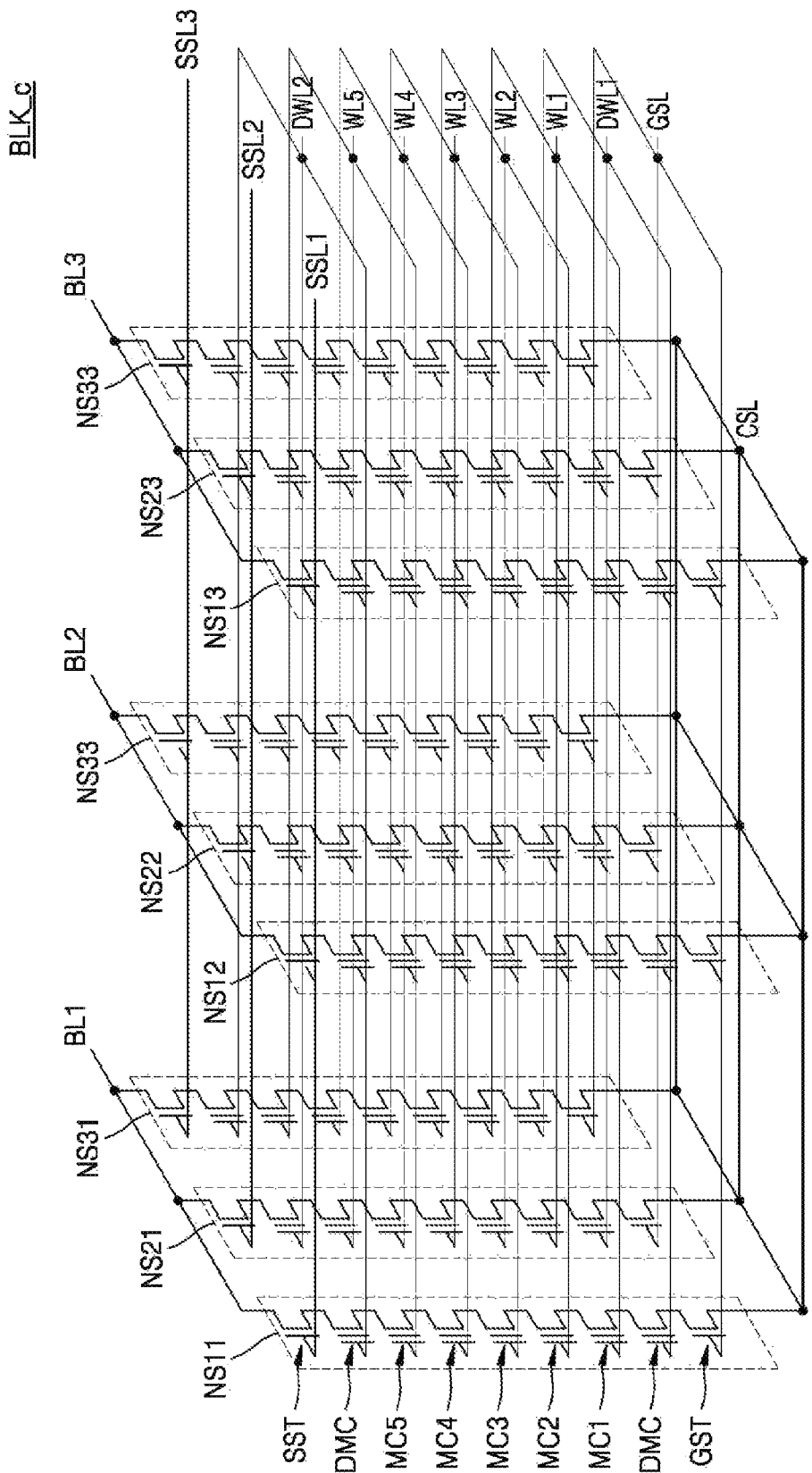
FIG. 24 is a circuit diagram illustrating another example of a memory block of FIG. 5.

FIG. 24 is a circuit diagram illustrating another example BLK_c of the memory block of FIG. 5.

In the memory block BLK_c according to the present embodiment of the inventive concept, at least one dummy memory cell DMC is disposed in each of the strings. In comparison with the memory block BLK_b shown in FIG. 6, in the memory block BLK_c shown in FIG. 24, the dummy memory cells DMC are disposed in each of the strings between a string selection transistor SST and memory cells MC1 to MC6, and between a ground selection transistor GST and the memory cells MC1 to MC6. The dummy memory cells DMC disposed at the same level are connected in common to dummy word lines DWL1 and DWL2. That is, the dummy word lines DWL2 are disposed between string selection lines SSL1 to SSL3 and the word lines WL1 to WL6, and the dummy word lines DWL1 are disposed between a ground selection line GSL and the word lines WL1 to WL6. A program order of memory cells included in the memory block BLK_c shown in FIG. 24 will be described with reference to FIGS. 25 and 26.

Figure 25:
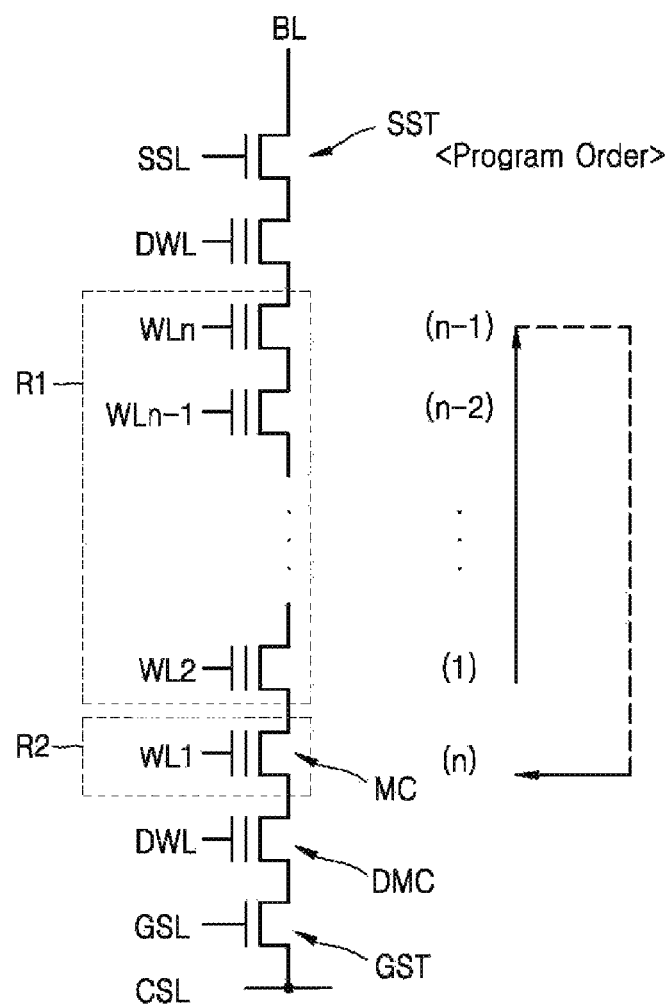
FIG. 25 is a diagram illustrating a program order of memory cells of the memory block of FIG. 24, according to a program method according to an embodiment of the inventive concept.

FIG. 25 is a diagram illustrating a program order of memory cells of the memory block BLK_c of FIG. 24, according to a program method according to an embodiment of the inventive concept. FIG. 26 is a table showing threshold voltages of the memory cells of FIG. 25 and voltages applied to the memory cells and the dummy memory cells DMC.

Referring to FIG. 25, memory cells MC respectively connected to n word lines WL1 to WLn are disposed between a ground selection transistor GST and a string selection transistor SST. Also, the dummy memory cells DMC are disposed between the ground selection transistor GST or the string selection transistor SST and the memory cells MC. A word line adjacent to a ground selection line GSL to a word line adjacent to a string selection line SSL are sequentially referred to as first to n-th word lines WL1 to WLn.

According to the program method as described above with reference to FIGS. 3 to 23, after memory cells of a first region R1 including an N-th word line (e.g., a second word line) are programmed, memory cells of an N−1-th word line (e.g., a first word line WL1) are programmed. In this case, as shown in FIG. 26, the program operation is performed such that a maximum value Vth2 of threshold voltages of the memory cells of the N−1-th word line WL(N−1) is equal to or lower than a maximum value Vth1 of threshold voltages of the memory cells of the N-th word line WL(N).

Thus, during a program operation, a maximum value Vpgm2 of program voltages applied to the memory cells of the N−1-th word line WL(N−1) is equal to or lower than a maximum value Vpgm1 of program voltages applied to the memory cells of the N-th word line WL(N).

Also, a pass voltage Vpass2 applied to the memory cells of the N−1-th word line WL(N−1) is equal to or lower than a pass voltage Vpass1 applied to the memory cells of the N-th word line WL(N). In this case, a bias voltage Vbias may be applied to a dummy word line DWL to prevent occurrence of a sharp variation in channel voltage. The bias voltage Vbias may be equal to or lower than a pass voltage Vpass2 applied to the memory cells of the N−1-th word line WL(N−1).

Figure 27:
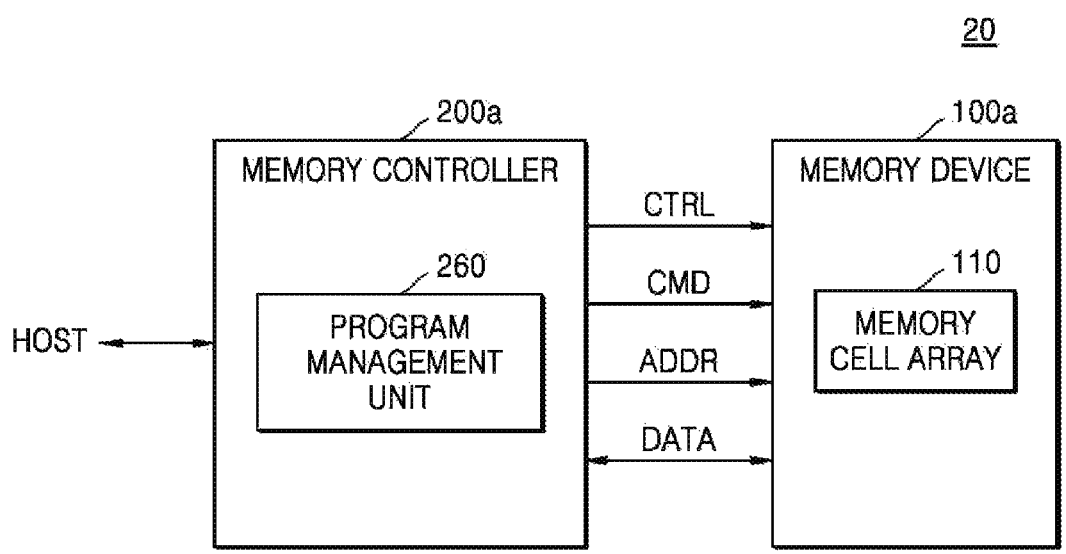
FIG. 27 is a schematic block diagram illustrating a memory system according to another embodiment of the inventive concept.

FIG. 27 is a schematic block diagram illustrating a memory system 20 according to another embodiment of the inventive concept.

Referring to FIG. 27, the memory system 20 includes a memory device 100a and a memory controller 200a. The memory device 100a includes a memory cell array 110, and the memory controller 200a includes a program management unit 260.

The memory controller 200a controls the memory device 100a to read data stored in the memory cell array 110 of the memory device 100a or write data to the memory cell array 110 in response to read/write requests from a host HOST. The memory device 100a performs a program (or write) operation, a read operation, and an erase operation on the memory cell array 110 based on an address ADDR, a command CMD, and a control signal CTRL provided by the memory controller 200a.

In this case, the program management unit 260 determines an order in which memory cells are programmed in the memory cell array 110, and controls the number of bits of data to be stored in the memory cells or a voltage level to be applied to the memory cells when the memory cells are programmed in the determined order. Similar to the embodiments described with reference to FIGS. 3 to 26, the program management unit 260 may determine a program order such that an N−1-th word line is programmed after memory cells of a first region including an N-th word line are programmed in a memory block. The program management unit 260 may provide a signal including a program order and a signal for controlling the number of bits of data to be stored in the memory cells or the voltage level to be applied to the memory cells as a command CMD to the memory device 100a. The memory device 100a may control a program order of the memory cells of the memory cell array 110 or a voltage applied to the memory cells based on the command CMD.

In one embodiment of the inventive concept, the program management unit 260 determines the number (e.g., single-bit or multi-bit) of bits of data that is programmed in memory cells of an N−1-th word line or a level of a program voltage such that a maximum value of threshold voltages of the memory cells of the N−1-th word line is equal to or lower than a maximum value of threshold voltages of memory cells of an N-th word line.

In another exemplary embodiment, the number of bits of data that is programmed in the memory cells of the N−1-th word line or the level of the program voltage may be controlled by a control logic (not shown) included in the memory device 100a.

Figure 28:
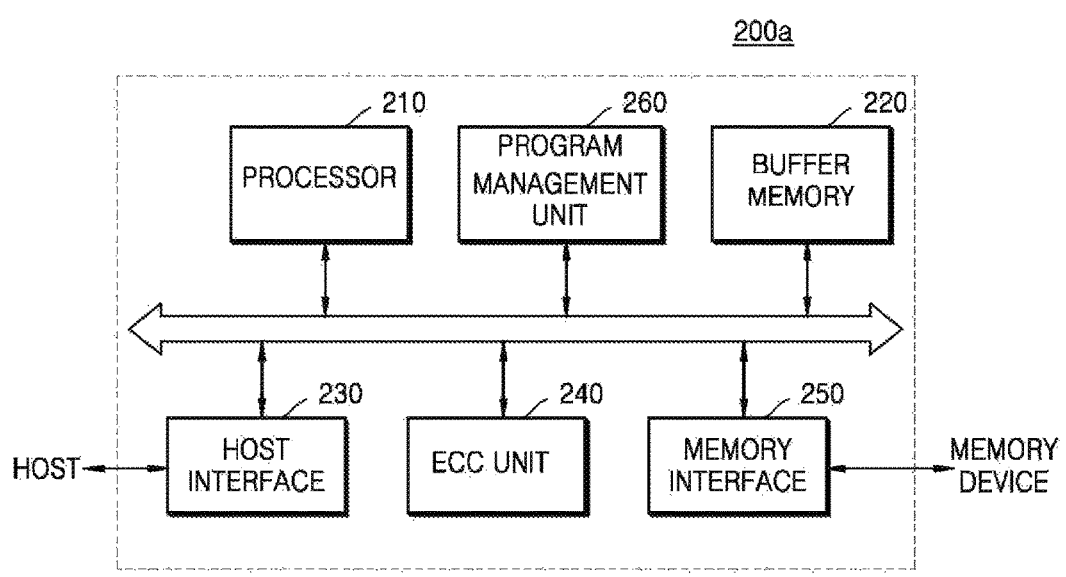
FIG. 28 is a block diagram illustrating an example embodying the memory controller of FIG. 27.

FIG. 28 is a block diagram illustrating an example embodying the memory controller 200a of FIG. 27.

Referring to FIG. 28, the memory controller 200a includes a processor 210, a buffer memory 220, a host interface 230, an ECC unit 240, a memory interface 250, and a program management unit 260. Although not shown in FIG. 28, the memory controller 200a may further include various other constituent elements, for example, a read-only memory (ROM) configured to store data codes required to initially boot a device including the memory system 20 or a buffer memory controller configured to control the buffer memory 220.

The host interface 230 provides an interface between a host and the memory controller 200a and receives a request for a memory operation from the host. For example, the host interface 230 may receive various requests such as data read and write requests from the host, and generate various internal signals for a memory operation on the memory device 100a in response to the various requests. For example, the memory controller 200a may communicate with the host via various standard interfaces. The standard interfaces may include various interfaces, such as ATA, SATA, external SATA (e-SATA), PATA, SCSI, SCSI (SAS), PCI, PCI express (PCI-E), IEEE 1394, USB, IDE, a secure digital (SD) card, a multimedia card (MMC), an embedded MMC (eMMC), and a compact flash (CF) card.

The processor 210 controls overall operations of the memory controller 200a, for example, various function blocks related to the memory operation on the memory device 100a. Also, the processor 210 may be configured to drive firmware for controlling the memory controller 200a. In the present embodiment of the inventive concept, the program management unit 260 is illustrated as a separate operation block. In another exemplary embodiment, the program management unit 260 may operate as a part of the processor 210. As described above with reference to FIG. 27, the program management unit 260 may determine an order in which memory cells are programmed in the memory cell array 110. The program management unit 260 may determine a program order such that an N−1-th word line is programmed after memory cells of a first region including an N-th word line are programmed. Also, the program management unit 260 may determine the number (e.g., single-bit or multi-bit) of bits of data that is programmed in memory cells of the N−1-th word line such that a maximum value of threshold voltages of the memory cells of the N−1-th word line is equal to or lower than a maximum value of threshold voltages of the memory cells of the N-th word line.

The buffer memory 220 may temporarily store data externally transmitted through the host interface 230 and data transmitted from the memory device 100a through the memory interface 250. Also, the buffer memory 220 may temporarily store data required to control the memory device 100a. In the present exemplary embodiment, the buffer memory 220 may temporarily store program order information generated by the program management unit 260. For example, the buffer memory 220 may include DRAM, SRAM, or a combination of DRAM and SRAM, but the inventive concept is not limited thereto.

The ECC unit 240 may perform a process of performing an error check and correct (ECC) encoding operation on write data and a process of performing an ECC decoding operation on read data by using an algorithm, such as a Reed-Solomon (RS) code, a hamming code, a cyclic redundancy code (CRC). For example, the ECC unit 240 may generate a result of detection of errors in data read from the memory device 100a and perform an error correction operation on the read data. For example, the ECC unit 240 may detect error bits by comparing a parity generated and stored during programming of data with parity bits generated during reading of data, and correct error bits by performing a predetermined logical operation (e.g., a logic exclusive OR (XOR)) on the detected error bits.

The memory interface 250 provides an interface between the memory controller 200a and the memory device 100a. For example, the memory interface 250 may transmit and receive write data and read data to and from the memory device 100a. Also, the memory interface 250 may further provide an interface between the memory controller 200a and the buffer memory 220.

Figure 29:
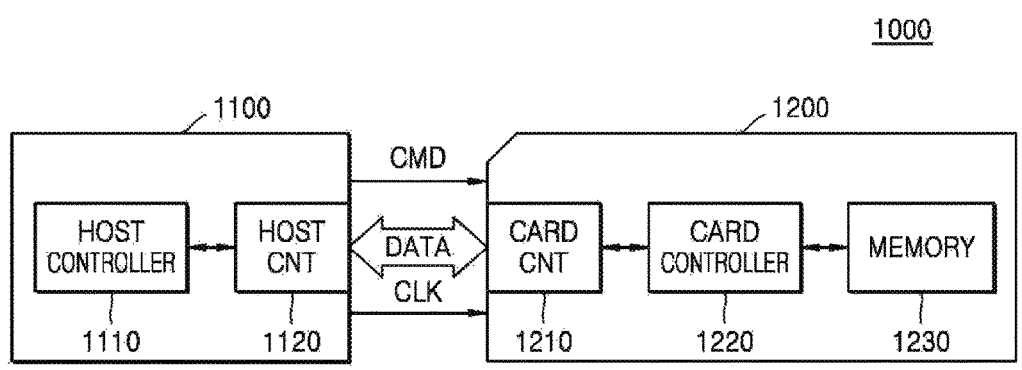
FIG. 29 is a block diagram illustrating an example of applying the memory system according to any one of the above-described embodiments of the inventive concept to a memory card system.

FIG. 29 is a block diagram illustrating an example of applying the memory system according to any one of the above-described embodiments of the inventive concept to a memory card system 1000.

Referring to FIG. 29, the memory card system 1000 includes a host 1100 and a memory card 1200. The host 1100 includes a host controller 1110 and a host connector 1120. The memory card 1200 includes a card connector 1210, a card controller 1220, and a memory device 1230. The memory card 1200 may be embodied by using the exemplary embodiments illustrated in FIGS. 1 to 28. Reliability of the memory card 1200 may be improved by controlling a program order of the memory device 1230 as described above with reference to FIGS. 3 to 26.

The host 1100 may write data to the memory card 1200 or may read data stored in the memory card 1200. The host controller 1110 transmits a command CMD, a clock signal CLK generated by a clock generator (not shown) in the host 1100, and data DATA, to the memory card 1200 via the host connector 1120.

The card controller 1220, in response to the command CMD received through the card connector 1210, may store the data DATA in the memory device 1230 in synchronism with the clock signal CLK generated by the clock generator in the host 1100. The memory device 1230 may store the data DATA transmitted from the host 1100.

The memory card 1200 may be embodied by a compact flash card (CFC), a microdrive, a smart media card (SMC), a multimedia card (MMC), a security digital card (SDC), a memory stick, a USB flash memory driver, or the like.

Figure 30:
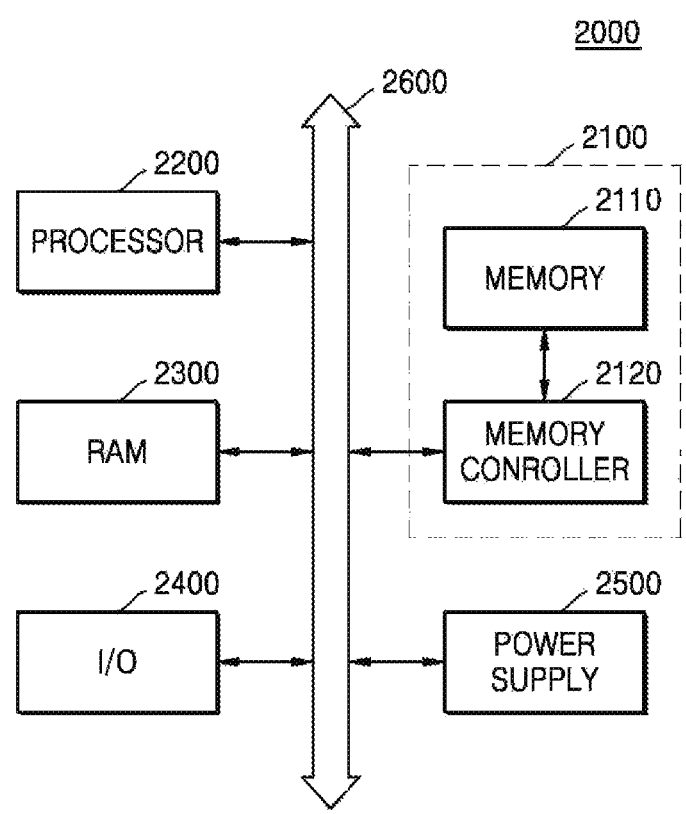
FIG. 30 is a block diagram illustrating a computing system including a memory system according to any one of the above-described embodiments of the inventive concept.

FIG. 30 is a block diagram illustrating a computing system 2000 including a memory system 2100 according to any one of the above-described exemplary embodiments.

Referring to FIG. 30, the computing system 2000 includes the memory system 2100, a processor 2200, RAM 2300, an input/output (I/O) device 2400, and a power supply 2500. Alternatively, although not illustrated in FIG. 30, the computing system 2000 may further include ports that may communicate with a video card, a sound card, a memory card, a USB device, etc. or other electronic devices. The computing system 2000 may be embodied by a personal computer or a portable electronic apparatus such as a laptop computer, a mobile phone, a personal digital assistant (PDA), and a camera.

The processor 2200 may perform particular calculations or tasks. In some exemplary embodiments, the processor 2200 may be a micro-processor (MP) or a central processing unit (CPU). The processor 2200 may perform communication with the RAM 2300, the I/O device 2400, and the memory system 2100 via a bus 2600 such as an address bus, a control bus, and a data bus. The memory system 2100 may be embodied by using the memory device illustrated in FIGS. 1 to 29. Memory cells of the memory device 2110 may be programmed according to the program method described above with reference to FIGS. 3 to 26. In the program method, a program order may be determined by a program order determiner (not shown) included in the memory device 2110 or the memory controller 2120.

According to an embodiment, the processor 2200 may be connected to an extended bus such as a peripheral component interconnect (PCI) bus.

The RAM 2300 may store data needed for the operation of the computing system 2000. For example, the RAM 2300 may be embodied by dynamic RAM (DRAM), mobile DRAM, static RAM (SRAM), PRAM, ferroelectric RAM (FRAM), and/or MRAM.

The I/O device 2400 may include an input device such as a keyboard, a keypad, or a mouse, and an output device such as a printer or a display. The power supply 2500 may supply an operating voltage needed for the operation of the computing system 2000.

Figure 31:
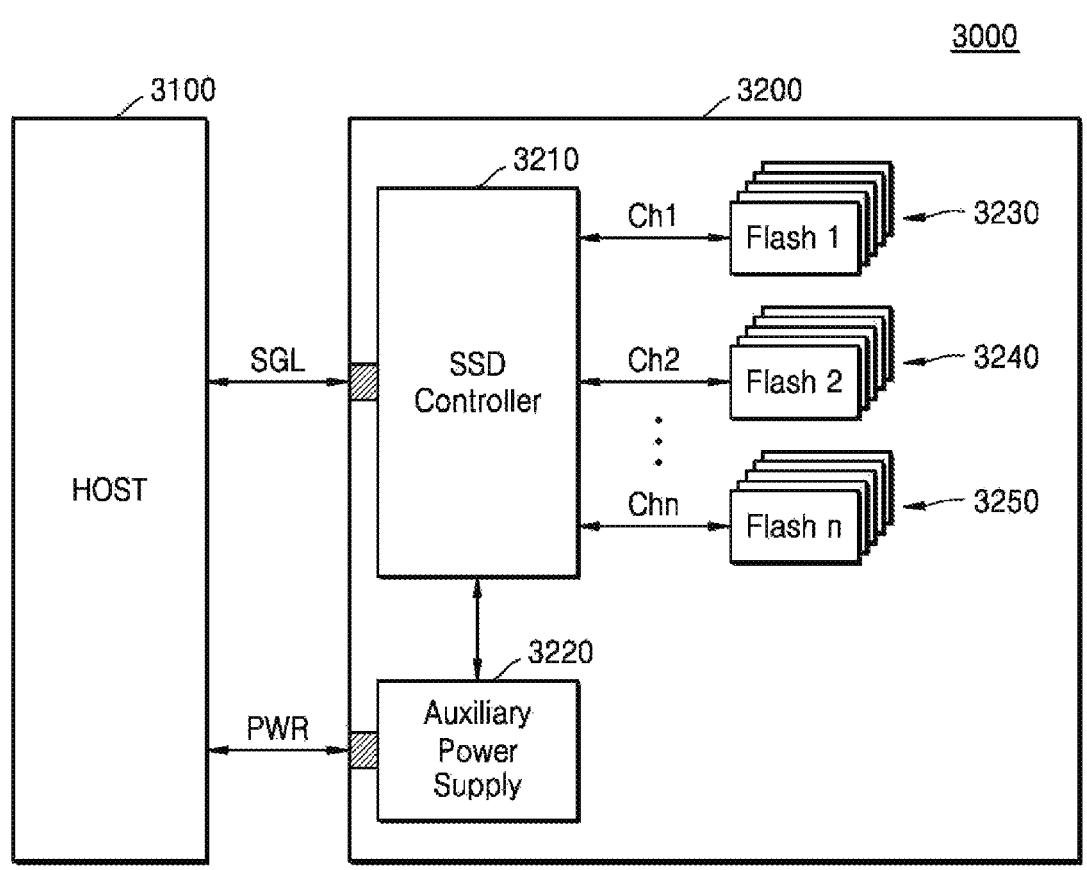
FIG. 31 is a block diagram illustrating an example of applying the memory system according to any one of the above-described embodiments of the inventive concept to a solid-state drive (SSD) system.

FIG. 31 is a block diagram illustrating an example of applying the memory system according to any one of the above-described embodiments of the inventive concept to a solid-state drive (SSD) system 3000.

Referring to FIG. 31, the SSD system 3000 includes a host 3100 and an SSD 3200. The SSD 3200 may exchange signals with the host 3100 via a signal connector (not shown) and may receive an input of power through a power connector (not shown). The SSD 3200 may include an SSD controller 3210, an auxiliary power supply 3220, and a plurality of memory devices 3230, 3240, and 3250. Each of the memory devices 3230, 3240, and 3250 may be a VNAND flash memory device. In this case, the SSD 3200 may be embodied by using the exemplary embodiments illustrated in FIGS. 1 to 30.

While the inventive concept has been particularly shown and described with reference to exemplary embodiments thereof, it will be understood that various changes in form and details may be made therein without departing from the spirit and scope of the following claims.

What is claimed is:

1. A method of programming a three dimensional (3D) non-volatile memory device including a plurality of memory cell strings arranged in a direction vertical to a substrate, each of the plurality of memory cell strings including N number of memory cells which are disposed in an order of a first to $N^{th}$ memory cells from the substrate, thereby the first memory cell being disposed closer to the substrate than the $N^{th}$ memory cell, and the N being an integer greater than three, the method comprising:
programming a first group of memory cells sequentially in an order from an $(N-i)^{th}$ memory cell to the first memory cell, i being an integer equal to or greater than one; and then
programming a second group of memory cells sequentially in an order from an $(N-i+1)^{th}$ memory cell to the $N^{th}$ memory cell,
wherein at least one of the memory cells, after being programmed, stores different number of data bits from a number of data bits other memory cells store.

2. The method of claim 1, wherein the first and the $N^{th}$ memory cells are programmed into single-level states respectively in which the first and the $N^{th}$ memory cells store one bit data respectively, and a second to $(N-1)^{th}$ memory cells are programmed into triple-level states in which each of the second to $(N-1)^{th}$ memory cells stores three-bit data.

3. The method of claim 1, wherein the first and the $N^{th}$ memory cells are programmed into single-level states respectively, and a second and an $(N-1)^{th}$ memory cells are programmed into multiple-level states respectively in which each of the second and the $(N-1)^{th}$ memory cells stores two-bit data.

4. The method of claim 3, wherein the second to $(N-2)^{th}$ memory cells are programmed into triple-level states respectively.

5. The method of claim 1, wherein each of the memory cell strings further includes a string select transistor to connect the memory cell string to a bit line.

6. The method of claim 5, wherein each of the memory cell strings further includes a dummy cell disposed between the $N^{th}$ memory cell and the string select transistor.

7. The method of claim 1, wherein each of the memory cell strings further includes a ground select transistor to connect the memory cell string to a common source line.

8. The method of claim 7, wherein each of the memory cell strings further includes a dummy cell disposed between the first memory cell and the ground select transistor.

9. The method of claim 1, wherein i equals 2.

10. A method of programming a three dimensional (3D) non-volatile memory device including a plurality of memory cell strings arranged in a direction vertical to a substrate, each of the plurality of memory cell strings including N number of memory cells which are disposed in an order of a first to $N^{th}$ memory cells from the substrate, thereby the first memory cell being disposed closer to the substrate than the $N^{th}$ memory cell, and the N being an integer greater than three, the method comprising:
programming a first group of memory cells sequentially in an order from a $j^{th}$ memory cell to an (N−k)th memory cell, j being an integer greater than one and k being an integer in which j being smaller than (N−k); then
programming a second group of memory cells sequentially in an order from a $(j-1)^{th}$ memory cell to the first memory cell; and
programming a third group of memory cells sequentially in an order from an $(N-k+1)^{th}$ memory cell to the $N^{th}$ memory cell,
wherein at least one of the memory cells, after being programmed, store different number of data bits from a number of data bits other memory cells store.

11. The method of claim 10, wherein the first and the $N^{th}$ memory cells are programmed into single-level states respectively in which the first and the $N^{th}$ memory cells store one bit data respectively, and a second to $(N-1)^{th}$ memory cells are programmed into triple-level states in which each of the second to $(N-1)^{th}$ memory cells stores three-bit data.

12. The method of claim 11, wherein the first and the $N^{th}$ memory cells are programmed into single-level states respectively, and the second and the $(N-1)^{th}$ memory cells are programmed into multiple-level states respectively in which each of the second and the $(N-1)^{th}$ memory cells stores two-bit data.

13. The method of claim 12, wherein the second to $(N-2)^{th}$ memory cells are programmed into triple-level states respectively.

14. The method of claim 10, wherein each of the memory cell strings further includes a string select transistor to connect the memory cell string to a bit line.

15. The method of claim 14, wherein each of the memory cell strings further includes a dummy cell disposed between the $N^{th}$ memory cell and the string select transistor.

16. The method of claim 10, wherein each of the memory cell strings further includes a ground select transistor to connect the memory cell string to a common source line.

17. The method of claim 16, wherein each of the memory cell strings further includes a dummy cell disposed between the first memory cell and the ground select transistor.

18. The method of claim 10, wherein j and k equal 2 respectively.

19. A method of programming a three dimensional (3D) non-volatile memory device including a plurality of memory cell strings arranged in a direction vertical to a substrate, each of the plurality of memory cell strings including N number of memory cells which are disposed in an order of a first to $N^{th}$ memory cells from the substrate, thereby the first memory cell being disposed closer to the substrate than the $N^{th}$ memory cell, and the N being an integer greater than three, the method comprising:
 programming a first group of memory cells sequentially in an order from a second memory cell to the $N^{th}$ memory cell; and then
 programming the first memory cell,
 wherein the first memory cell, after being programmed to have a program state, has a first threshold voltage which is substantially smaller than threshold voltages of the memory cells in the first group after being programmed to have a same program state.

20. The method of claim 19, wherein the second memory cell, after being programmed to have the same program state, has a second threshold voltage in which the second threshold voltage is substantially smaller than the threshold voltages of other memory cells in the first group after being programmed to have the same program state.

* * * * *